(12) United States Patent
Bedeschi

(10) Patent No.: US 11,790,970 B2
(45) Date of Patent: Oct. 17, 2023

(54) 3D QUILT MEMORY ARRAY FOR FERAM AND DRAM

(71) Applicant: Micron Technology, Inc., Boise, ID (US)

(72) Inventor: Ferdinando Bedeschi, Biassono (IT)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 17/420,976

(22) PCT Filed: Jul. 14, 2020

(86) PCT No.: PCT/IB2020/020036
§ 371 (c)(1),
(2) Date: Jul. 6, 2021

(87) PCT Pub. No.: WO2022/013590
PCT Pub. Date: Jan. 20, 2022

(65) Prior Publication Data
US 2022/0328087 A1    Oct. 13, 2022

(51) Int. Cl.
*G11C 11/22* (2006.01)
(52) U.S. Cl.
CPC ...... *G11C 11/2257* (2013.01); *G11C 11/2255* (2013.01); *G11C 11/2259* (2013.01); *G11C 11/2273* (2013.01); *G11C 11/2275* (2013.01)
(58) Field of Classification Search
CPC ............ G11C 11/2257; G11C 11/2255; G11C 11/2259; G11C 11/2273
See application file for complete search history.

(56) References Cited

U.S. PATENT DOCUMENTS

| | | | |
|---|---|---|---|
| 7,391,640 B2 | 6/2008 | Tang et al. |
| 8,243,493 B2 | 8/2012 | Toda |
| 10,127,978 B2 | 11/2018 | Oh et al. |
| 2003/0099125 A1 | 5/2003 | Kang |
| 2016/0315119 A1 | 6/2016 | Nakatsuka |

(Continued)

FOREIGN PATENT DOCUMENTS

| | | |
|---|---|---|
| CN | 105702286 A | 6/2016 |
| TW | 201832229 A | 9/2018 |

OTHER PUBLICATIONS

ISA/KR, International Search Report and Written Opinion of the International Searching Authority, Int'l Appl. No. PCT/IB2020/020036, dated Mar. 31, 2021, Korean Intellectual Property Office, Seo-gu, Daejeon, Republic of Korea, 12pgs.

(Continued)

*Primary Examiner* — Han Yang
(74) *Attorney, Agent, or Firm* — Holland & Hart LLP

(57) ABSTRACT

Methods, systems, and devices for memory array with multiplexed select lines are described. In some cases, a memory cell of the memory device may include a storage component, a first transistor coupled with a word line, and a second transistor coupled with a selection line to selectively couple the memory cell with a digit line. The selection line may be provided in parallel to each digit line for multiplexing the digit lines toward a sense amplifier while a plurality of drivers, one for each selection line, may be provided in a staggered configuration under the memory array and split in even drivers and odd drivers for corresponding adjacent tiles of the memory array.

16 Claims, 16 Drawing Sheets

(56) References Cited

U.S. PATENT DOCUMENTS

2018/0114578 A1* 4/2018 Ishizu .................. G11C 7/10
2018/0122455 A1* 5/2018 Yamada ............. G11C 11/4091
2020/0066339 A1    2/2020 Laurent

OTHER PUBLICATIONS

Taiwan Patent Office, "Office Action and Search Report", issued in connection with Taiwan Patent Application No. 110125449 dated Jul. 4, 2022 (33 pages).

* cited by examiner

3D QUILT MEMORY ARRAY FOR FERAM AND DRAM

CROSS REFERENCE

The present application for patent is a 371 national phase filing of International Patent Application No. PCT/IB2020/020036 by Bedeschi, entitled "3D Quilt Memory Array for FeRAM and DRAM", filed Jul. 14, 2020, which is assigned to the assignee hereof and is expressly incorporated by reference in its entirety herein.

BACKGROUND

The following relates generally to one or more memory systems and more specifically to a 3D memory array with multiplexed digit lines, in particular for FeRAM and DRAM.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., flash memory or FeRAM, can store data for extended periods of time even in the absence of an external power source. Volatile memory devices, DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may be able to achieve densities similar to volatile memory but may have non-volatile properties due to the use of a ferroelectric capacitor as a storage device. FeRAM devices may thus have improved performance, compared to other non-volatile and volatile memory devices. It is desirable, however, to improve the operation of FeRAM devices. For example, it may be desirable to have improved noise resistance during memory cell sensing, more compact circuits and reduced layout size, and improved timing for operation of FeRAM devices.

Improving memory devices, generally, may include increasing memory cell density, increasing read/write speeds, increasing reliability, increasing data retention, reducing power consumption, or reducing manufacturing costs, among other metrics. Improved solutions for saving space in the memory array, increasing the memory cell density, or decreasing overall power usage of the memory array may be desired.

DETAILED DESCRIPTION

Figure 1:
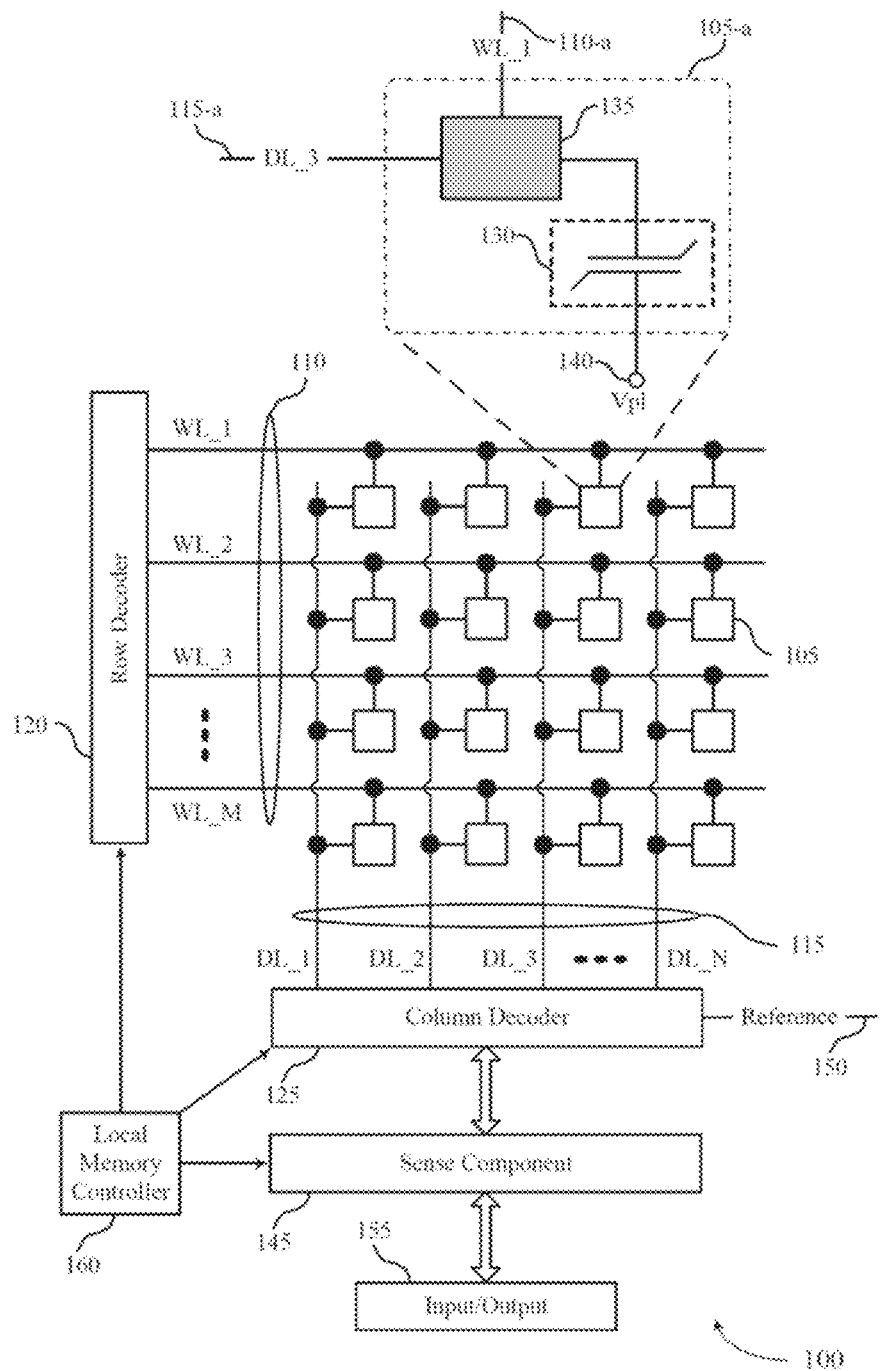
FIG. 1 illustrates an example of a memory die that supports a memory array with multiplexed digit lines in accordance with examples as disclosed herein.

Some memory devices may include an array of memory cells coupled with digit lines. The memory cells may be coupled with a sense component using the digit lines to perform access operations on the memory cells (e.g., a write operation or a read operation). As distances between digit lines decrease to increase a density of the array, some undesired effects (e.g., noise) may increase. For example, when a digit line is activated during an access operation (e.g., selected and coupled with a memory cell), a voltage change associated with the activated digit line may be partially transferred (e.g., capacitively coupled) to neighboring unselected digit lines. As a result, noise may be injected through the unselected portions of the memory array into a selected digit line during the access operation. The memory array may include a one or more shunt transistors to mitigate such undesired effects. The shunt transistors may be used to reduce disturbances between selected and unselected digit lines. However, the shunt transistors and associated shunt lines may increase a size of the memory die area used by the memory array and increase the overall power usage of the memory array.

Systems, devices, and techniques are described herein to mitigate disturbances between selected digit lines and unselected digit lines during an access operation and to reduce a quantity of shunt lines or shunt transistors (or both) used in a memory array. For example, a sense component of memory device may be coupled with a set of digit lines, each associated to a corresponding select line. In such cases, the set of digit lines may be multiplexed with the input of the sense component. For example, each digit line of the set may be coupled with a transistor, e.g., a transistor driven by the select line associated to the digit line, configured to selectively couple that particular digit line of the set with the sense component—e.g., multiplexed digit lines associated with the sense component. Further, the select line may be coupled with one or more of the transistors of the selection component of a memory cell and the sense component. In such examples, the sense component may be configured to access memory cells associated with more than one digit line. In such cases, a single select line may be configured to couple at least two digit lines with a sense component at a time, including a selected digit line and an unselected digit line; the unselected digit line may be used as reference digit line, in some examples. The size of the die area used by the memory array may be reduced as compared with other solutions. In some cases, the sense component may be configured to use both a signal from the selected digit line and a signal from the unselected digit line to perform a read operation, thereby decreasing the overall power usage of the memory array.

Features of the disclosure are initially described in the context of memory systems, dies and circuit diagrams as described with reference to FIGS. 1-3 and 6. Features of the disclosure are described with reference to example memory cell structures and example tile configurations as depicted in FIGS. 4-5 and 7-10. These and other features of the disclosure are further illustrated by and described with reference to a flowchart that relate to a method of manufacturing a memory array with multiplexed digit lines as described with references to FIG. 11.

According to some examples, a memory device may include:
  memory cells structured in a 3D array formed by a plurality of memory tiles with each cell coupled with a digit line and a plate line;
  at least a storage component, a first transistor, and a second transistor for each memory cell;
  one of said transistors having one terminal coupled with a word line configured to select the memory cell for an access operation;
  the other of said transistors having one terminal coupled to said digit line;
  a selection line being provided in parallel to each digit line for multiplexing the digit lines toward a sense amplifier;
  a plurality of drivers, one for each selection line, provided in a staggered configuration under the memory array and split in even drivers and odd drivers for corresponding adjacent tiles of the memory array.

The memory cells of the 3D array are DRAM cells or FeRAM cells.

According to further examples, a 3D memory device may include:
  a quilt array of memory cells;
  each memory cell being coupled with a digit line and a plate line, the memory cell comprising at least a storage component, a first transistor, and a second transistor;
  a word line coupled with a terminal of one of said transistors and configured to select the memory cell for an access operation;
  said digit line being coupled with a terminal of the other of said transistors;
  a selection line for said digit line configured in parallel to the digit line;
  a driver for the selection line located under the memory array;
  even drivers and odd drivers for corresponding selection lines being spit under corresponding tiles of the array of memory cells.

Moreover, the 3D memory array includes at least a couple of decks and the selection lines associated to a top or bottom deck are connected to corresponding drivers through contact vias provided in a socket area between adjacent tiles of the memory array.

According to further examples, a method for manufacturing a 3D memory device may include memory cells each comprising at least a storage component, a first transistor, and a second transistor, the method comprising:
structuring the memory array as a plurality of even and odd memory tiles;
structuring the 3D array in at least a couple of decks with top and bottom layers of cells for each memory tile;
including word line drivers, digit line drivers and selection line drivers in corresponding even and odd driver areas under corresponding tiles of the memory array;
providing staggered interconnections between said drivers and the corresponding lines of each deck in socket areas between even and odd tiles.

FIG. 1 illustrates an example of a memory die 100 that supports a memory array with multiplexed digit lines in accordance with examples as disclosed herein. In some cases, the memory die 100 may be referred to as a memory chip, a memory device, or an electronic memory apparatus. The memory die 100 may include one or more memory cells 105 that are programmable to store different logic states. Each memory cell 105 may be programmable to store two or more states. For example, the memory cell 105 may be configured to store one bit of digital logic at a time (e.g., a logic 0 and a logic 1). In some cases, a single memory cell 105 (e.g., a multi-level memory cell) may be configured to store more than one bit of digit logic at a time (e.g., a logic 00, logic 01, logic 10, or a logic 11).

A memory cell 105 may store a charge representative of the programmable states in a capacitor. For instance, DRAM architectures may include a capacitor that includes a dielectric material to store a charge representative of the programmable state. In other memory architectures, other storage devices and components are possible. For example, nonlinear dielectric materials may be employed. In some cases, such a capacitor may be alternatively referred to as a container (or a cell container).

Operations such as reading and writing may be performed on memory cells 105 by activating or selecting access lines such as a word line 110 and/or a digit line 115. In some cases, digit lines 115 may also be referred to as bit lines. References to access lines, word lines and digit lines, or their analogues, are interchangeable without loss of understanding or operation. Activating, selecting, biasing a word line 110 or a digit line 115 may include applying a voltage to the respective line.

The memory die 100 may include the access lines (e.g., the word lines 110 and the digit lines 115) arranged in a grid-like pattern, such as a matrix. Memory cells 105 may be positioned at intersections of the word lines 110 and the digit lines 115. By biasing a word line 110 and a digit line 115 (e.g., applying a voltage to the word line 110 or the digit line 115), a single memory cell 105 may be accessed at their intersection.

Accessing the memory cells 105 may be controlled through a row decoder 120 or a column decoder 125. For example, a row decoder 120 may receive a row address from a local memory controller 160 and activate a word line 110 based on the received row address. A column decoder 125 may receive a column address from the local memory controller 160 and may activate a digit line 115 based on the received column address. For example, the memory die 100 may include multiple word lines 110, labeled WL_1 through WL_M, and multiple digit lines 115, labeled DL_1 through DL_N, where M and N depend on the size of the memory array. Thus, by activating a word line 110 and a digit line 115, e.g., WL_1 and DL_3, the memory cell 105 at their intersection may be accessed. The intersection of a word line 110 and a digit line 115, in either a two-dimensional or three-dimensional configuration, may be referred to as an address of a memory cell 105.

The memory cell 105 may include a storage component 130 (e.g., a capacitor, a container or an alternative physical element) and a selection component 135 (which may be referred to as a switching component). The selection or switching component 135 may include one or more transistors (e.g., two transistors connected in a series configuration) or any other type of switching devices that selectively establishes or de-establishes electronic communication between two components. A first node of the storage component 130 may be coupled with the selection component 135 and a second node of the storage component 130 may be coupled with a voltage source 140. In some cases, the voltage source 140 may be the cell plate reference voltage, such as Vpl, or may be ground, such as Vss. In some cases, the voltage source 140 may be an example of a plate line coupled with a plate line driver. The selection component 135 may be further coupled with a select line that is omitted in FIG. 1 to improve clarity of illustrating the components of interest for the present disclosure. In such cases, the select line may be configured to selectively couple the memory cell 105 with the digit line 115. Examples of configurations for the selection component 135 are described with reference to FIGS. 2, 3, and 4.

Selecting or deselecting the memory cells 105 may be accomplished by activating or deactivating the selection component 135. In other words, the storage component 130 may be in electronic communication with the digit line 115 using the selection component 135. For example, the storage component 130 may be isolated from digit line 115 when the selection component 135 is deactivated and the storage component 130 may be coupled with digit line 115 when the selection component 135 is activated. In some cases, the selection component 135 include at least a transistor and its operation may be controlled by applying a voltage to the transistor gate, where the voltage differential between the transistor gate and transistor source may be greater or less than a threshold voltage of the transistor. In some cases, the selection component 135 may include a p-type transistor or an n-type transistor. In some cases, the selection component 135 may include at least a vertical transistor. The word line 110 may be in electronic communication with the gate of the selection component 135 and may activate/deactivate the selection component 135 based on a voltage being applied to word line 110.

In some cases, the selection component 135 of memory cell 105 may include a couple of transistors (e.g., a first transistor and a second transistor). In such cases, selecting the memory cell 105 may include biasing the word line 110 coupled with the first transistor of the selection component 135. Biasing the word line 110 may also select additional memory cells 105 coupled with the biased word line 110. Further, coupling the selected memory cell 105 with the digit line 115 may include biasing the select line coupled with the second transistor of selection component 135. In this manner, selecting the memory cell 105 and coupling the selected memory cell 105 may include activating the first transistor and the second transistor of the selection component 135. In other words, additional memory cell 105 that has been selected by the biased word line 110 (e.g., the first transistor of the selection component 135 is activated) may remain decoupled with their respective digit lines 115 (e.g., the second transistor of the selection component 135 is deactivated).

A word line 110 may be a conductive line in electronic communication with a memory cell 105 that is used to perform access operations on the memory cell 105. In some architectures, the word line 110 may be in electronic communication with a gate of a selection component 135 (e.g., a gate of the first transistor) of a memory cell 105 and may be configured to control the selection component 135 of the memory cell 105. In some architectures, the word line 110 may be in electronic communication with a node of the capacitor of the memory cell 105 and the memory cell 105 may not include a selection component.

A digit line 115 may be a conductive line that connects the memory cell 105 with a sense component 145. In some architectures, the memory cell 105 may be selectively coupled with the digit line 115 during portions of an access operation. For example, the word line 110 and the selection component 135 of the memory cell 105 may be configured to couple and/or isolate the capacitor of the memory cell 105 and the digit line 115. In some architectures, the memory cell 105 may be in electronic communication (e.g., constant) with the digit line 115.

The sense component 145 may be configured to detect a state (e.g., a charge) stored on the logic storage component (e.g., capacitor) of the memory cell 105 and determine a logic state of the memory cell 105 based on the stored state. The charge stored by a memory cell 105 may be extremely small, in some cases. As such, the sense component 145 may include one or more sense amplifiers to amplify the signal output by the memory cell 105. The sense amplifiers may detect small changes in the charge of a digit line 115 during a read operation and may produce signals corresponding to a logic state 0 or a logic state 1 based on the detected charge. During a read operation, the capacitor of memory cell 105 may output a signal (e.g., discharge a charge) to its corresponding digit line 115. The signal may cause a voltage of the digit line 115 to change. The sense component 145 may be configured to compare the signal received from the memory cell 105 across the digit line 115 to a reference signal 150 (e.g., reference voltage). The sense component 145 may determine the stored state of the memory cell 105 based on the comparison.

For example, in binary-signaling, if digit line 115 has a higher voltage than the reference signal 150, the sense component 145 may determine that the stored state of memory cell 105 is a logic 1 and, if the digit line 115 has a lower voltage than the reference signal 150, the sense component 145 may determine that the stored state of the memory cell 105 is a logic 0. The sense component 145 may include various transistors or amplifiers to detect and amplify a difference in the signals. In some cases, the sense component 145 may be part of another component (e.g., a column decoder 125, row decoder 120). In some cases, the sense component 145 may be coupled or in electronic communication with the row decoder 120 or the column decoder 125. In some cases, the sense component 145 may be configured to selectively couple with a set of digit lines 115 during a read operation.

The local memory controller 160 may control the operation of memory cells 105 through the various components (e.g., row decoder 120, column decoder 125, and sense component 145). In some cases, one or more of the row decoder 120, column decoder 125, and sense component 145 may be co-located with the local memory controller 160. The local memory controller 160 may be configured to receive commands and/or data from an external memory controller, translate the commands and/or data into information that can be used by the memory die 100, perform one or more operations on the memory die 100, and communicate data from the memory die 100 to the external memory controller in response to performing the one or more operations. The local memory controller 160 may generate row and column address signals to activate the target word line 110 and the target digit line 115. The local controller may also activate a target select line associated to the target digit line. The local memory controller 160 may also generate and control various voltages or currents used during the operation of the memory die 100. In general, the amplitude, shape, or duration of an applied voltage or current discussed herein may be adjusted or varied and may be different for the various operations discussed in operating the memory die 100.

In some cases, the local memory controller 160 may be configured to perform a write operation (e.g., a programming operation) on one or more memory cells 105 of the memory die 100. During a write operation, a memory cell 105 of the memory die 100 may be programmed to store a desired logic state. In some cases, a plurality of memory cells 105 may be programmed during a single write operation. The local memory controller 160 may identify a target memory cell 105 on which to perform the write operation. The local memory controller 160 may identify a target word line 110, a target digit line 115 in electronic communication with the target memory cell 105 (e.g., the address of the target memory cell 105) and the target associated selection line. The local memory controller 160 may activate the target word line 110, the target selection line and the target digit line 115 (e.g., applying a voltage to the word line 110, target selection line and/or digit line 115), to access the target memory cell 105. The local memory controller 160 may apply a specific signal (e.g., voltage) to the digit line 115 during the write operation to store a specific state (e.g., charge) in the storage component 130 of the memory cell 105, the specific state (e.g., charge) may be indicative of a desired logic state.

In some cases, the local memory controller 160 may be configured to perform a read operation (e.g., a sense operation) on one or more memory cells 105 of the memory die 100. During a read operation, the logic state stored in a memory cell 105 of the memory die 100 may be determined. In some cases, a plurality of memory cells 105 may be sensed during a single read operation. The local memory controller 160 may identify a target memory cell 105 on which to perform the read operation. The local memory controller 160 may identify a target word line 110 and a target digit line 115 in electronic communication with the target memory cell 105 (e.g., the address of the target memory cell 105) and a target selection line associated to the target digit line. The local memory controller 160 may activate the target word line 110, the target selection line and the target digit line 115 (e.g., applying a voltage to the word line 110, the target selection line and/or digit line 115), to access the target memory cell 105. The target memory cell 105 may transfer a signal to the sense component 145 in response to biasing the access lines. The sense component 145 may amplify the signal. The local memory controller 160 may fire the sense component 145 (e.g., latch the sense component) and thereby compare the signal received from the memory cell 105 to the reference signal 150. Based on that comparison, the sense component 145 may determine a logic state that is stored on the memory cell 105. The local memory controller 160 may communicate the logic state stored on the memory cell 105 to the external memory controller as part of the read operation.

Figure 2:
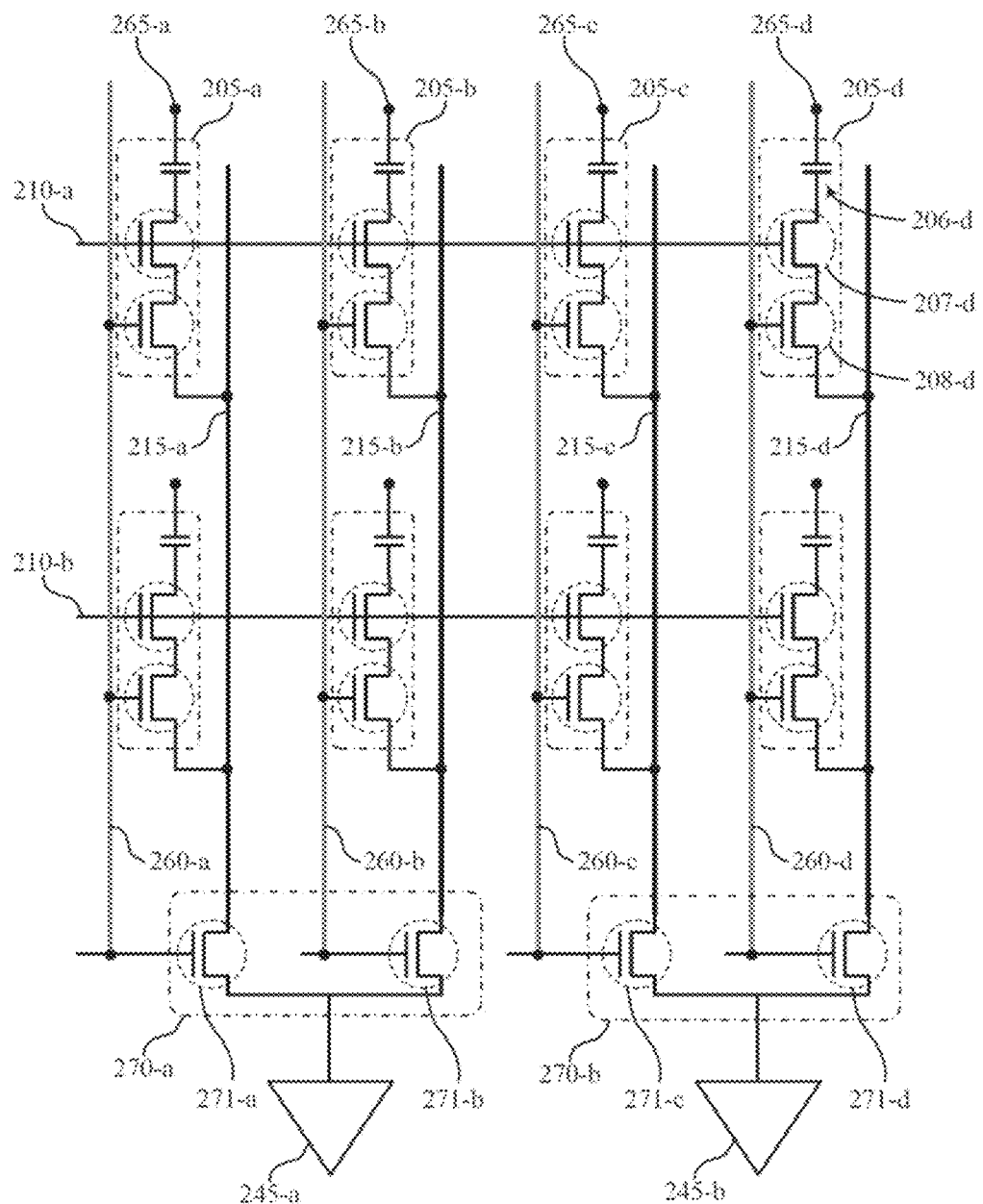
FIG. 2 illustrates an example of a circuit diagram that supports a memory array with multiplexed digit lines in accordance with examples as disclosed herein.

FIG. 2 illustrates an example of a circuit diagram 200 that supports a memory array with multiplexed digit lines in accordance with examples as disclosed herein. The circuit diagram 200 illustrates an example of a configuration of memory cell that includes a selection component with two transistors and a configuration of a multiplexer associated with the digit lines. The circuit diagram 200 may include memory cells 205 (which may be examples of memory cells 105 described with reference to FIG. 1), word lines 210 (which may be examples of word lines 110 described with reference to FIG. 1), digit lines 215 (which may be examples of digit lines 115 described with reference to FIG. 1), sense components 245 (which may be examples of sense components 145 described with reference to FIG. 1), select lines 260, plate lines 265, and digit line multiplexing component 270. The circuit diagram 200 may illustrate a memory array including eight (8) memory cells 205 coupled with two (2) word lines 210 and four (4) digit lines 215. The circuit diagram 200 may be considered as illustrating two (2) sub-arrays that each include four (4) memory cells 205 coupled with two (2) word lines and two (2) digit lines. Further, each sub-array of four memory cells 205 is coupled with the sense component 245.

The memory cell 205 may include a storage component 206 (which may be an example of the storage component 130 described with reference to FIG. 1) configured to store a logic state of the memory cell 205. In some cases, a node of storage component 206 may be coupled with the plate lines 265 as depicted in the circuit diagram 200. In some cases, the plate lines 265 may be biased to a constant voltage (e.g., plate voltage) during a portion of read operation. In some cases, the memory cell 205 may include a selection component (e.g., the selection component 135 described with reference to FIG. 1) including more than one transistor—e.g., a first transistor 207 and a second transistor 208 connected in a series configuration. The first transistor 207 may be further coupled with the storage component 206 and the word line 210. The second transistor 208 may be further coupled with the digit line 215 and the select line 260.

The storage component 206 may be coupled with the digit line 215 when both transistors are activated—e.g., the first transistor 207 activated by the word line 210 and the second transistor 208 activated by the select line 260. The locations of the first transistor 207 and the second transistor 208 may be interchangeable. A biased word line 210 may activate or select all memory cells 205 coupled with the biased word line 210 (e.g., memory cells 205-a through memory cells 205-d when the word line 210-a is biased to activate the first transistors 207 coupled with the biased word line 210-a), and the second transistors 208 may provide an additional degree of freedom as to a particular memory cell 205 may be coupled with a respective digit line 215 (e.g., a selected digit line 215). For example, one of the selected memory cells (e.g., memory cell 205-a) may be coupled with a respective digit line (e.g., digit line 215-a) by biasing one of the select lines (e.g., select line 260-a) while other selected memory cells (e.g., memory cell 205-b) may remain decoupled from the digit lines 215. Similarly, the selected memory cell 205-c may be coupled with the digit line 215-c by biasing the select line 260-c while the selected memory cell 205-d may remain decoupled from the digit line 215-d by debiasing the select line 260-d.

The additional degree of freedom provided by the second transistors 208 may facilitate sharing the sense component 245 with more than one digit line 215. For example, the sense component 245-a may be shared by digit line 215-a and digit line 215-b. The digit line multiplexing component 270 may include a set of transistors that each may be coupled with a respective digit line. For example, the digit line multiplexing component 270-a depicted in the circuit diagram 200 may include a first multiplexing transistor 271-a coupled with the digit line 215-a and a second multiplexing transistor 271-b coupled with the digit line 215-b. Further, each multiplexing transistor may be coupled with respective select line 260. As such, the second transistor 208 of the memory cell 205 and the multiplexing transistor 271 may be coupled with a common select line 260 and a particular memory cell 205 may be coupled with a respective digit line that may be further coupled with the sense component 245 at a time. In this manner, more than one digit lines 215 may be multiplexed with the single sense component 245 at any given time during a read operation— e.g., the sense component 245 coupled with multiplexed digit lines 215.

Memory cells 205 that include more than one transistor— the first transistor 207 activated by the word line 210 and the second transistor 208 activated by the select line 260—may also utilize different timings for access operations. In some examples, the first transistor 207 may be activated by biasing the word line 210 before the second transistor 208 is activated by biasing the select line 260. In some other examples, the second transistor 208 may be activated by biasing the select line 260 before the first transistor 207 is activated by biasing the word line 210. In yet other examples, the first transistor 207 and the second transistor 208 may be activated at the same time or near the same time. In such examples, the word line 210 and the select line 260 may be biased at the same time or near the same time. In examples where the select line 260 is biased before the word line 210, the sense component 245 may be coupled with the digit line 215 before the memory cell 205 is coupled with the digit line 215.

Further, the additional degree of freedom provided by the second transistor 208 of the memory cell 205 may alleviate some issues related to reducing spaces between digit lines 215 (e.g., digit lines having a reduced pitch) in an effort to decrease an area occupied by a memory array. In some cases, a tight digit line pitch may result in significant read disturbs. In the context of memory device including a memory array, read disturbs may refer to adverse effects on logic states stored in memory cells that are coupled with unselected digit lines when a digit line (e.g., a digit line next to the unselected digit lines) is activated (e.g. coupled with a memory cell 105 to read a logic state stored in the memory cell 105 using a sense component). In some cases, the activated digit line may be referred to as an aggressor and the unselected digit lines next to the activated digit line may be referred to as victims. In such cases, the second transistor 208 may couple a memory cell 205 with a selected digit line 215 (e.g., aggressor) while other second transistors 208 may maintain other memory cells 205 decoupled with the unselected digit lines 215 (e.g., victims). Although part of voltage changes associated with the aggressor digit line may be coupled (e.g., through capacitive coupling) to the victim digit line(s), the logic states stored in the other memory cells 205 may be protected from such voltage changes. In some cases, the victim digit lines may be coupled with a constant voltage (e.g., a plate voltage). In other cases, the victim digit lines may be configured to float. In this manner, read disturbs may be mitigated by the memory cell 205 that includes two transistors.

In some cases, the sense component 245 coupled with multiplexed digit lines 215 as described herein may provide a greater area for designing the sense component 245 (e.g., when compared to an area to incorporate multiple sense components that each may be dedicated to a single digit line). In some cases, sharing a sense component 245 among a set of digit lines 215 may reduce overall circuit area occupied by the sense component 245. Such area reduction may facilitate adding different functional circuits (e.g., sub-word line drivers) in the substrate that supports a memory array including the memory cells 205. In some cases, having a greater area for designing the sense component 245 may facilitate building a more sophisticated functionality into the sense component 245 (e.g., full-charge extraction function, threshold voltage compensation function).

In some cases, a memory device may include a memory cell coupled with a digit line and a plate line, where the memory cell includes a storage component and two transistors connected in a series configuration. The memory device may further include a word line coupled with a gate of a first transistor of the two transistors and configured to select the memory cell, and a select line coupled with a gate of a second transistor of the two transistors and configured to couple the memory cell with the digit line. The memory device may include a sense component configured to selectively couple with a plurality of digit lines including the digit line, and a third transistor coupled with the select line and configured to selectively couple the digit line with the sense component during at least a portion of a read operation.

In some cases, a first node of at least one of the two transistors is coupled with the storage component and a second node of another of the two transistors is coupled with the digit line. In some cases, the first transistor is coupled with the storage component at the first node and the second transistor is coupled with the digit line at the second node. In some cases, the first transistor is coupled with the digit line at the second node and the second transistor is coupled with the storage component at the first node. In some cases, the memory device may further include a second memory cell coupled with the word line and a second digit line of the plurality, and a fourth transistor configured to selectively couple the second digit line of the plurality with the sense component, a gate of the fourth transistor coupled with a second select line. In some cases, the storage component may be coupled with the plate line. In some cases, the memory cell includes a dynamic random access memory (DRAM) cell. In some cases, the memory cell includes a non-volatile ferroelectric memory (FeRAM) cell.

In some cases, a memory device may include a memory cell, a word line coupled with the memory cell, a digit line coupled with the memory cell and extending in a first direction, a select line coupled with the memory cell and extending in the first direction, the select line configured to selectively couple the memory cell with the digit line, a sense component configured to be selectively coupled with a plurality of digit lines that include the digit line, and a first transistor configured to selectively couple the digit line with the sense component, a gate of the first transistor coupled with the select line.

In some cases, the memory device may further include a second memory cell coupled with the word line and a second digit line of the plurality, and a second transistor configured to selectively couple the second digit line of the plurality with the sense component, a gate of the second transistor coupled with a second select line. In some cases, the word line extends in a second direction orthogonal to the first direction. In some cases, the first direction and the second direction are parallel to a surface of a substrate.

Figure 2A:
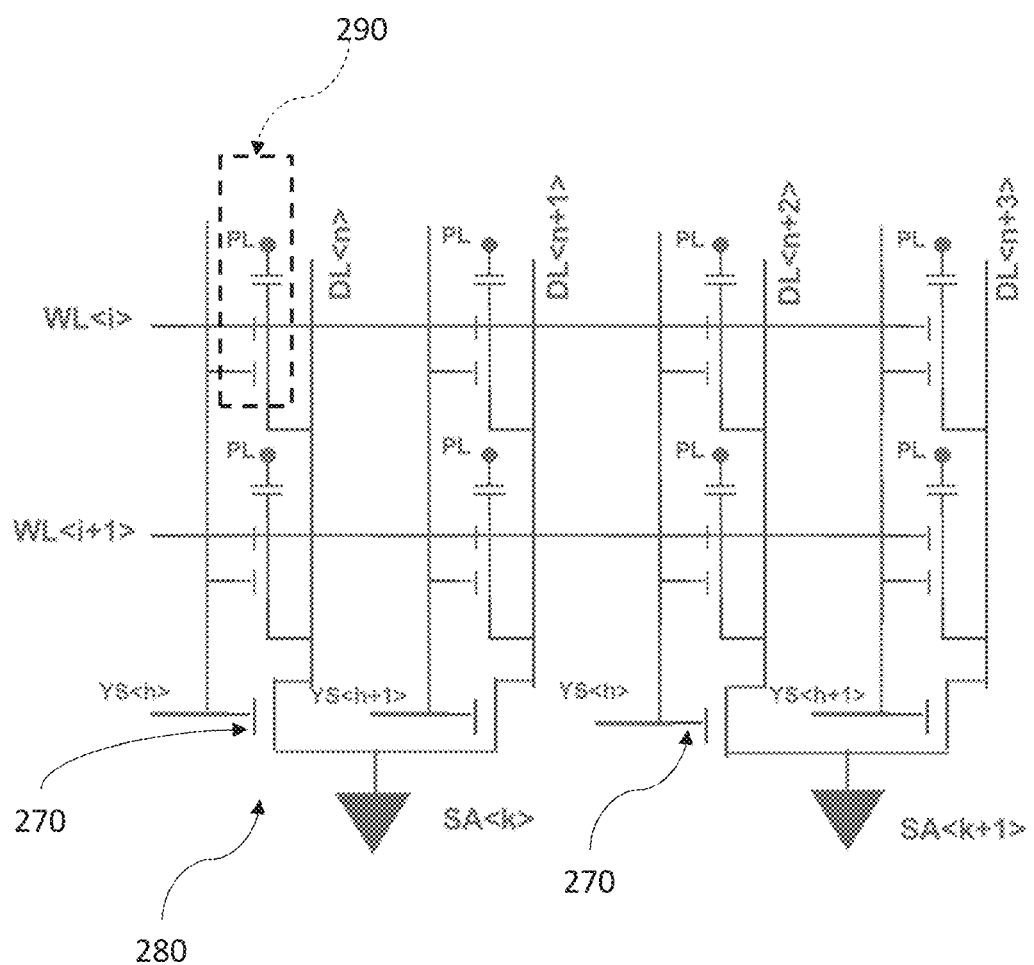
FIG. 2A illustrates a more general example of a circuit diagram that supports a 3D memory array with multiplexed digit lines in accordance with examples as disclosed herein.

FIG. 2A illustrates an example of a circuit diagram 280 that supports a 3D memory array with multiplexed digit lines in accordance with examples as disclosed herein. The circuit diagram 280 illustrates an example of a configuration of memory cell that includes a selection component with two transistors and a configuration of select lines YS<h> and YS<h+1> each associated with corresponding digit lines DL<n>, DL<n+1>, DL<n+2>, etc., for multiplexing. The circuit diagram 280 may include memory cells 290 (which may be examples of memory cells 105 described with reference to FIG. 1), word lines WL<i> (which may be examples of word lines 110 described with reference to FIG. 1), digit lines DL<n> (which may be examples of digit lines 115 described with reference to FIG. 1), sense components SA<k> (which may be examples of sense components 145 described with reference to FIG. 1), select lines YS<h>, plate lines PL, and digit line multiplexing component 270. The circuit diagram 280 may illustrate a memory array including a plurality of memory cells 290 coupled with a plurality of word lines WL<i> and digit lines DL<n>. The circuit diagram 280 may be considered as illustrating a couple of sub-arrays each of which includes at least four memory cells 290 coupled with at least two word lines WL<i> and WL<i+1> and four digit lines DL<n>, DL<n+1>, DL<n+2>, DL<n+3>. Moreover, each sub-array of four memory cells 290 is coupled with the sense component SA<k> and SA<k+1>.

As may be appreciated from the schematic example of FIG. 2A the shown memory architecture may be considered an example of 3D structure with digit lines extended vertically and with the memory array covered by plate lines PL. In the examples of the present disclosure the plates are solid and shorted together.

Figure 3:
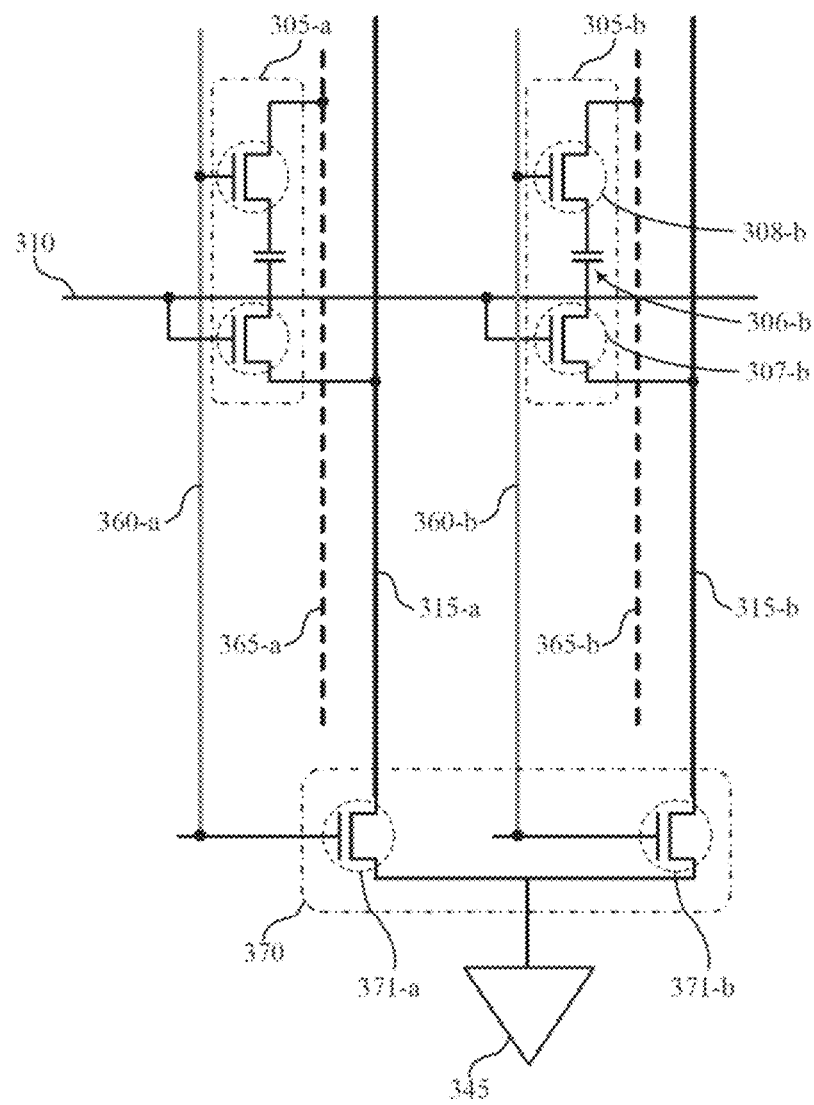
FIG. 3 illustrates an example of a circuit diagram that supports a memory array with multiplexed digit lines in accordance with examples as disclosed herein.

FIG. 3 illustrates an example of a circuit diagram 300 that supports a memory array with multiplexed digit lines in accordance with examples as disclosed herein. The circuit diagram 300 illustrates an example of a configuration of memory cell that includes a selection component with two transistors and a configuration of a multiplexer associated with the digit lines. The circuit diagram 300 includes memory cells 305 (which may be examples of memory cells 105 or memory cells 205 and 290 described with reference to FIGS. 1 and 2-2A), a word line 310 (which may be an example of word lines 110 or word lines 210 described with reference to FIGS. 1 and 2), digit lines 315 (which may be examples of digit lines 115 or digit lines 215 described with reference to FIGS. 1 and 2), a sense component 345 (which may be an example of sense component 145 or sense components 245 described with reference to FIGS. 1 and 2), select lines 360 (which may be examples of select lines 260 described with reference to FIG. 2), plate lines 365 (which may be examples of plate lines 265 described with reference to FIG. 2), and a digit line multiplexing component 370 (which may be an example of digit line multiplexing components 270 described with reference to FIG. 2).

The memory cell 305 may be considered an alternative example of the memory cell 205 described with reference to FIG. 2. For example, the transistors 307 and 308 may each be coupled with the storage element 306. The memory cell 305 may include a storage component 306 (which may be an example of storage component 206 described with reference to FIG. 2) coupled with a first transistor 307 (which may be an example of the first transistor 207 described with reference to FIG. 2) and a second transistor 308 (which may be an example of the second transistor 208 described with reference to FIG. 2). The first transistor 307 may be coupled with the word line 310 (e.g., a gate of first transistor 307-b coupled with word line 310) and the digit line 315. The second transistor 308 may be coupled with the select line 360 (e.g., a gate of second transistor 308-b coupled with select line 360-b) and the plate line 365. The plate line 365 may be interchangeable with the digit line 315 without loss of understanding or operation of the memory cell 305 as depicted in the circuit diagram 300.

The circuit diagram 300 may include portions of the circuit diagram 200 described with reference to FIG. 2 or FIG. 2A. For example, the storage component 306 of the memory cell 305 may be connected between the plate line 365 and the digit line 215 to determine a logic state stored in the storage component 306 when the first transistor 307 and the second transistor 308 are both activated during a read operation. In other words, the memory cells 305 may be activated (e.g., a word line 310 is biased to activate the first transistors 307 associated with the word line 310) and coupled with the respective digit lines 315.

In addition, the second transistor 308 may be activated (e.g., a select line 360 is biased to activate the second transistor 308) to couple the storage component 306 with the plate line 365 to complete a current path between the plate line 365 and the digit line 315. As described herein, the select lines 360 in conjunction with the second transistor 308 may provide the additional degree of freedom to selectively couple one of activated memory cells 305 (e.g., memory cell 305-a and memory cell 305-b coupled with the word line 310) with the respective digit line 315 (e.g., memory cell 305-a with digit line 315-a, memory cell 305-a with digit line 315-a). In some examples, the second transistor 308 may be activated by biasing the select line 360 before the first transistor 307 is activated by biasing the word line 310.

In addition, a multiplexing transistor 371 (which may be examples of the multiplexing transistors 271 described with reference to FIG. 2) of the digit line multiplexing component 370 may be activated by biasing the select line 360 so as to couple one of the digit lines 315 with the sense component 345 that may be configured to selectively couple with a set of digit lines. In examples where the select line 360 is biased before the word line 310, the sense component 345 may be coupled with the digit line 315 before the memory cell 305 is coupled with the digit line 315.

In some cases, a memory device may include a memory cell coupled with a digit line and a plate line, where the memory cell includes a storage component, a first transistor coupled with the storage component and the digit line, and a second transistor coupled with the storage component and the plate line. The memory device may include a word line coupled with a gate of the first transistor and configured to selectively couple the storage component with the digit line, and a select line coupled with a gate of the second transistor and configured to selectively couple the storage component with the plate line. The memory device may further include a sense component configured to selectively couple with a plurality of digit lines including the digit line, and a third transistor coupled with the select line and configured to selectively couple the digit line with the sense component during at least a portion of a read operation.

In some cases, the memory device may further include a second memory cell coupled with the word line and a second digit line of the plurality, and a fourth transistor configured to selectively couple the second digit line of the plurality with the sense component, where a gate of the fourth transistor is coupled with a second select line.

Figure 4A:
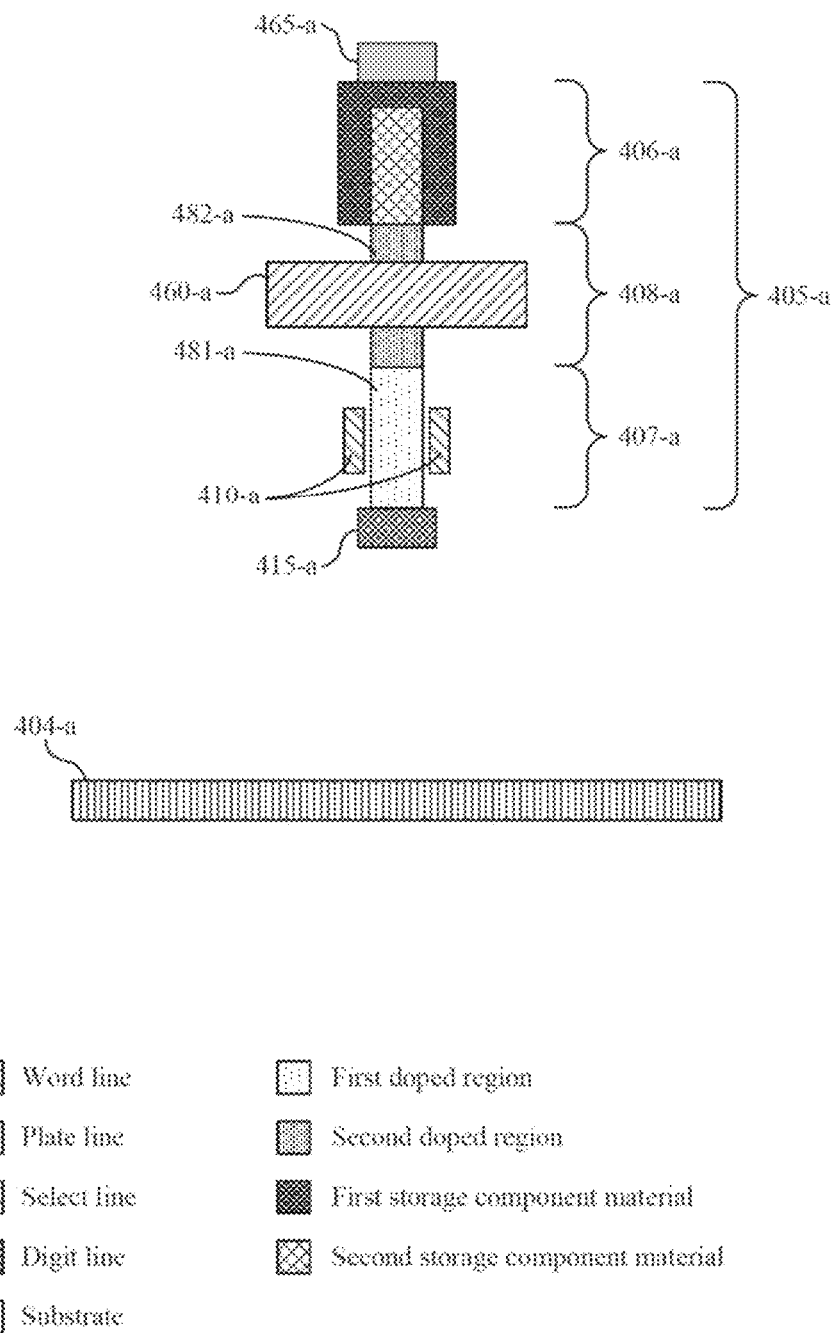
FIGS. 4A and 4B illustrate examples of cross-sectional side views of a portion of a memory array with multiplexed digit lines in accordance with examples as disclosed herein.
Figure 4B:
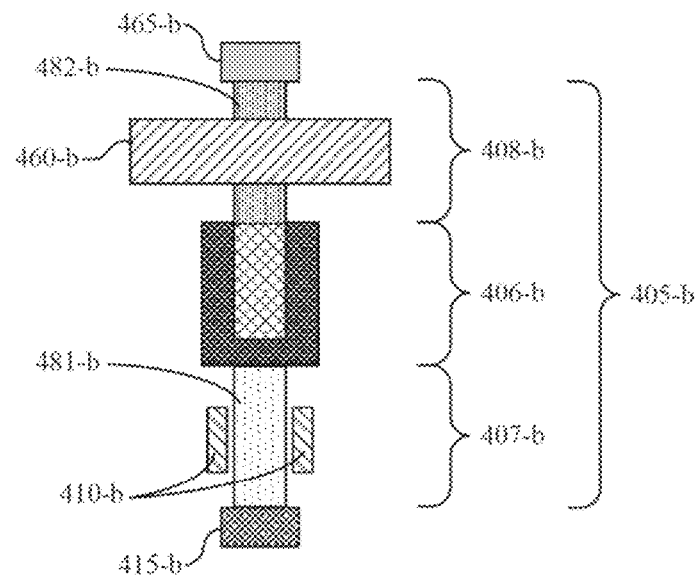
Figure 4B:

FIG. 4A and FIG. 4B illustrate respective examples of cross-sectional side views 401 and 402 of a portion of a memory array with multiplexed digit lines in accordance with examples as disclosed herein. The cross-sectional side views 401 and 402 illustrate that transistors 407 and 408 may be examples of vertical transistors. In some cases, the memory array may be located above a substrate. The cross-sectional side view 401 (or the cross-sectional side view 402) depicts a substrate 404, a word line 410 (which may be an example of word lines 210 or word lines 310 described with reference to FIGS. 2, 2A and 3), a digit line 415 (which may be an example of digit lines 215 or digit lines 315 described with reference to FIGS. 2, 2A and 3), a plate line 465 (which may be an example of plate lines 265 or plate lines 365 described with reference to FIGS. 2, 2A and 3), and a select line 460 (which may be an example of select lines 260 or select lines 360 described with reference to FIGS. 2, 2A and 3). Further, the cross-sectional side view 401 (or the cross-sectional side view 402) depicts a memory cell 405 (which may be an example of memory cell 205 or memory cell 305 described with reference to FIGS. 2, 2A and 3) that includes a storage component 406 (which may be an example of the storage component 206 or the storage component 306 described with reference to FIGS. 2, 2A and 3), a first vertical transistor 407 (which may be an example of the first transistor 207 or the first transistor 307 described with reference to FIGS. 2, 2A and 3), and a second vertical transistor 408 (which may be an example of the second transistor 208 or the second transistor 308 described with reference to FIGS. 2, 2A and 3).

The first vertical transistor 407 may include a first gate coupled with the word line 410 and a first doped region 481 extending in a first direction away from a surface of the substrate 404. Further, the second vertical transistor 408 may include a second gate coupled with the select line 460 and a second doped region 482 extending in the first direction away from the surface of the substrate 404. In some cases, the first direction may be orthogonal to the surface of the substrate 404.

In some cases, the word line 410 may extend in a second direction parallel to a plane defined by the surface of the substrate 404. In some cases, the select line 460 may extend in a third direction parallel to the plane defined by the surface of the substrate 404, where the third direction may be orthogonal to the second direction. In some cases, the select line 460 may be configured to couple the digit line 415 associated with the memory cell 405 with a sense component configured to selectively couple with a set of digit lines including the digit line 415 during a read operation.

In some cases, the first doped region 481 may be a first distance away from the surface of the substrate 404 and the second doped region 482 may be a second distance away from the surface of the substrate 404 different than the first distance. In some cases, the word line 410 may be a first distance away from the surface of the substrate 404 and the select line 460 may be a second distance away from the surface of the substrate 404 different than the first distance.

FIG. 4A illustrates the cross-sectional side view 401 of memory cell 405-*a* that may be an example of the memory cell 205 described with reference to FIG. 2. The memory cell 405-*a* may correspond to the memory cell 205 described with reference to FIG. 2 except that the location of first transistor 207 is interchanged with the location of second transistor 208— e.g., the second vertical transistor 408 is coupled with the storage component 406 in the memory cell 405-*a*. The cross-sectional side view 401 illustrates that a first node of storage component 406-*a* is coupled with the plate line 465-*a* and a second node of storage component 406-*a* is coupled with a first node of the second vertical transistor 408-*a*. Further, a second node of the second vertical transistor 408-*a* is further coupled with a second node of the first vertical transistor 407-*a*.

Moreover, a first node of the first vertical transistor 407-*a* is coupled with the digit line 415-*a*. In some cases, a first node of the first vertical transistor 407-*a* may be coupled with a first node of the storage component 406-*a* and a first node of the second vertical transistor 408-*a* may be coupled with the digit line 415-*a*—e.g., locations of the first vertical transistor 407-*a* and the second vertical transistor 408-*a* may be interchanged.

Still referring to FIG. 4A, the storage component 406-*a* may be a third distance away from the surface of the substrate 404 and the third distance may be greater than the first distance (e.g., the distance between the first doped region 481 and the surface of the substrate 404) or the second distance (e.g., the distance between the second doped region 482 and the surface of the substrate 404).

In some cases, such a configuration depicted in FIG. 4A may facilitate forming the first vertical transistor 407 and the second vertical transistor 408 without considering a thermal budget restriction associated with the storage component 406. For example, an anneal temperature that exceeds the thermal budget may be used to activate dopant atoms within the first doped region 481 (or the second doped region 482) because the storage component 406-*a* may not yet be formed.

FIG. 4B illustrates the cross-sectional side view 402 of memory cell 405-*b* that may be an example of the memory cell 305 described with reference to FIG. 3. The cross-sectional side view 402 illustrates that a first node of the first vertical transistor 407-*b* may be coupled with a first node of the storage or container component 406-*b* and a first node of the second vertical transistor 408-*b* may be coupled with a second node of the storage or container component 406-*b*.

Further, a second node of the first vertical transistor 407-*b* may be coupled with the digit line 415-*b* and a second node of the second vertical transistor 408-*b* may be coupled with the plate line 465-*b*. The cross-sectional side view 402 of memory cell 405-*b* illustrates that the storage component 406-*b* may have been formed when the second vertical transistor 408-*b* is formed. As such, process conditions to form the second vertical transistor 408-*b* may be restricted so as not to exceed the thermal budget associated with the storage component 406, in some cases.

If compared with the previous example of FIG. 4A, the memory cell 405-b includes a couple of transistors 407-b and 408-b, more particularly two vertical transistors of the TFT type, that are located at the opposite sites of the storage or container component 406-b. In the cell of FIG. 4A the two transistors are adjacent one to the other while in the cell of FIG. 4B they are located at the sides of the storage component.

We may consider that this basic memory cell, in both versions, including two transistors (2T) and a storage component (1C) can be identified as a 2T-1C memory cell that is particularly suitable for cross point selection according to the present disclosure.

Figure 4C:
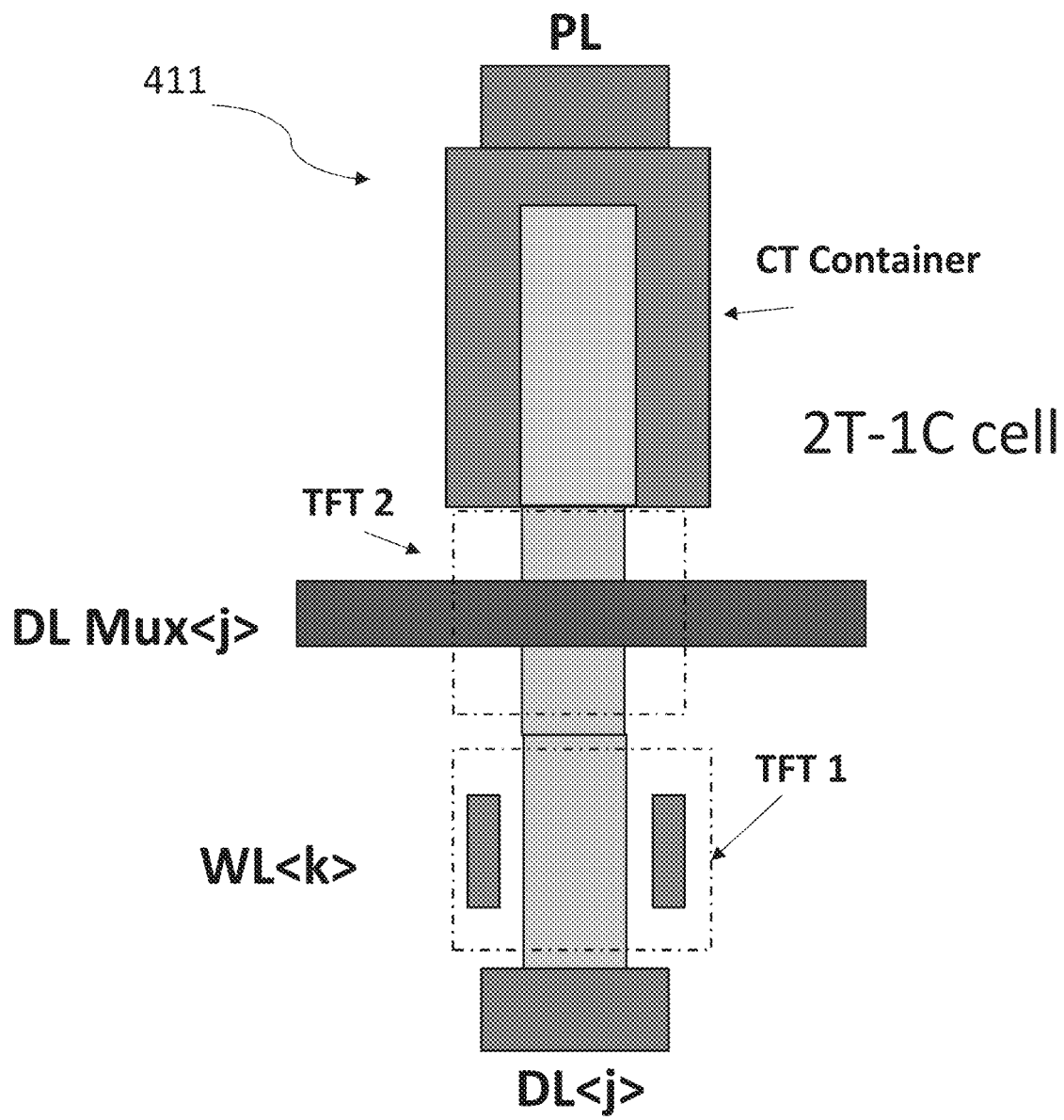
FIGS. 4C and 4D illustrate examples of cross-sectional side views of a portion of a 3D memory array with multiplexed digit lines in accordance with examples as disclosed herein.
Figure 4D:
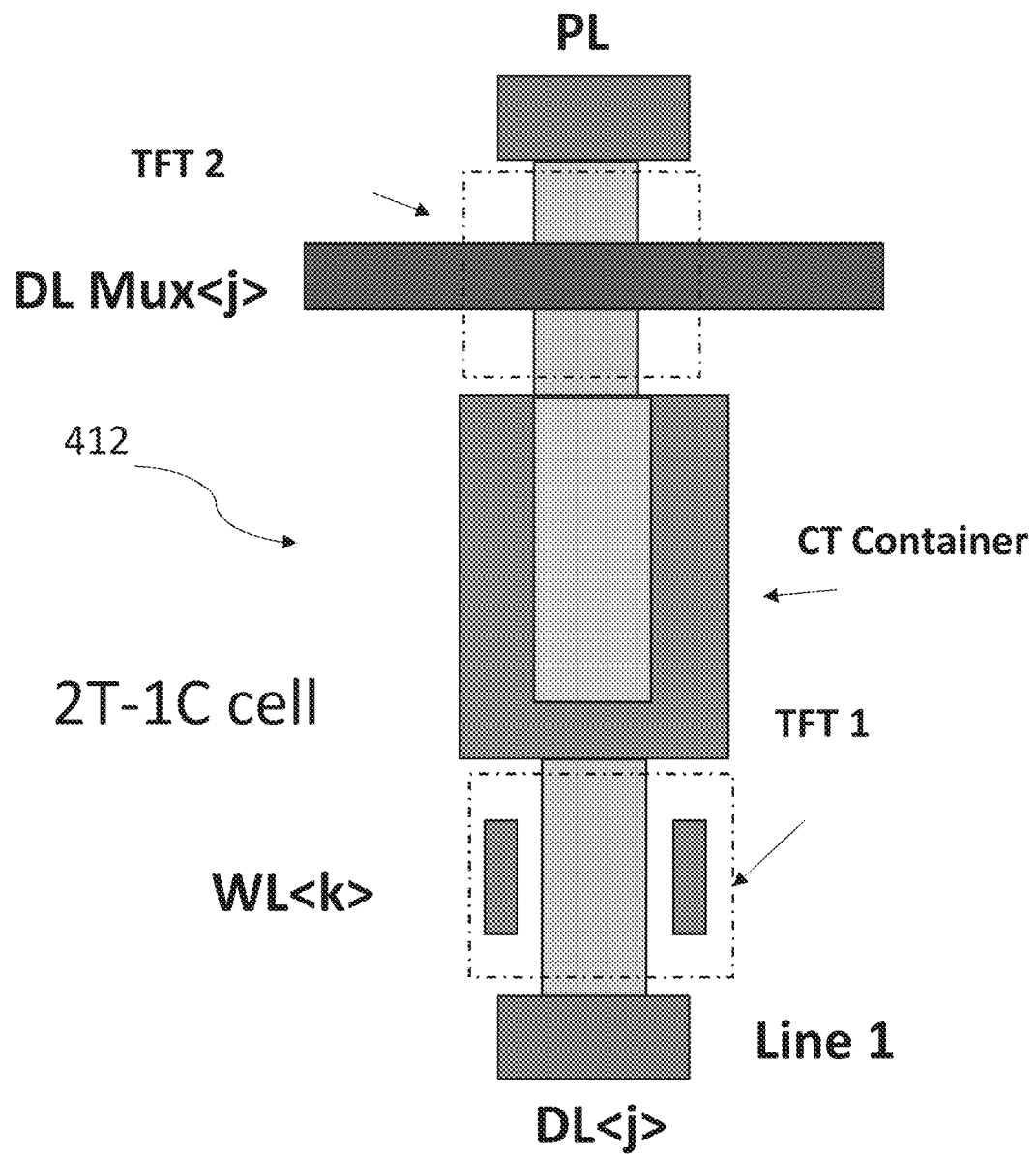

FIG. 4C and FIG. 4D illustrate respective examples of cross-sectional side views 411 and 412 of a portion of a 3D memory array with multiplexed digit lines in accordance with examples as disclosed herein. The cross-sectional side views 411 and 412 illustrate that transistors TFT1 and TFT2 may be examples of vertical MOSFET transistors such as Thin Film Transistors. In some cases, the memory array may be located above a substrate. The cross-sectional side view 411 (or the cross-sectional side view 412) depicts a generic K word line WL<k> similar to the word lines of the previous examples, a generic J select line DL Mux<J> similar to the select lines of the previous examples, and a storage or container component CT, serially connected between a plate line PL and a digit line DL<j>. Select line DL Mux<j> may be associated to corresponding digit line DL<j> and (not shown in FIGS. 4C-4D) act as multiplexing line for coupling digit line DL<j> to a respective sense component.

The first vertical transistor TFT1 may include a gate terminal coupled with the word line WL<k> while the second vertical transistor TFT2 may include a gate terminal coupled with the multiplexing select line DL Mux<J>.

Figure 5:
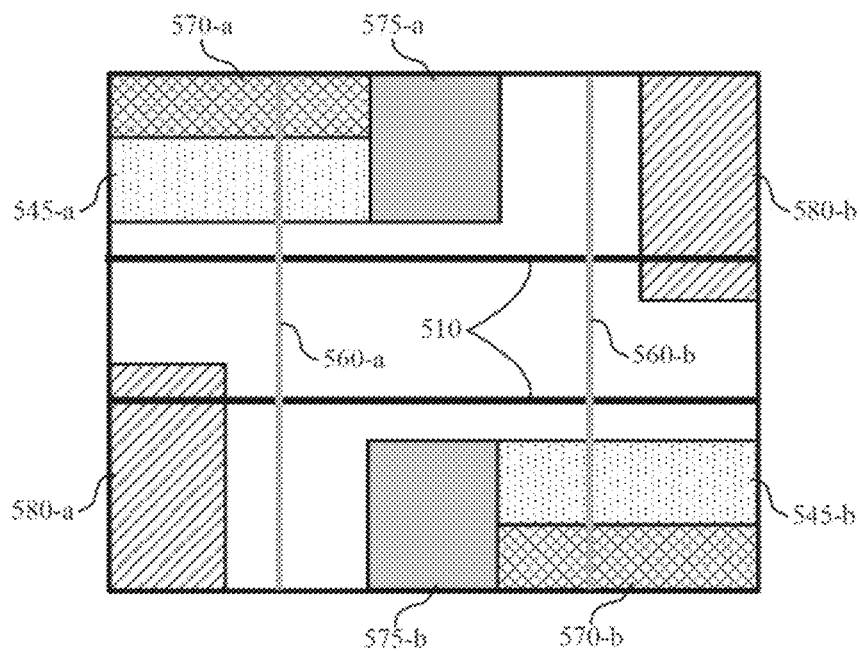
FIG. 5 illustrates an example of a memory tile configuration that supports a memory array with multiplexed digit lines in accordance with examples as disclosed herein.

One or the other of the memory cells shown schematically in the FIGS. 4C and 4D may be used to configure a 3D memory array of the present disclosure. We will see later how a 3D array of DRAM cells or FeRAM cells can be structured in order to reduce the consumption for activating the sense amplifiers FIG. 5 illustrates an example of a memory tile configuration 500 that supports a memory array with multiplexed digit lines in accordance with examples as disclosed herein. The memory tile configuration 500 illustrates only a portion of components in a substrate (e.g., substrate 404 described with reference to FIG. 4) of a memory tile for clarity purposes. The memory tile configuration 500 may include sense components 545 (which may be examples of the sense component 245 or the sense component 345 described with reference to FIGS. 2, 2A and 3), digit line multiplexing components 570 (which may be examples of the digit line multiplexing component 270 or the digit line multiplexing component 370 described still with reference to FIGS. 2, 2A and 3), digit line multiplexing component drivers 575, and sub-word line drivers (SWD) 580. In some cases, a memory array including memory cells (e.g., memory cells 405 described with reference to FIG. 4) may be located above the substrate and the memory array may include a set of word lines 510 and a set of select lines 560. Further, the memory array may include a set of digit lines (e.g., digit lines 415 described with reference to FIG. 4) and a set of plate lines (e.g., plate lines 465 described with reference to FIG. 4).

The sense component 545 may be configured to selectively couple with the set of digit lines during at least a portion of a read operation. The digit line multiplexing component 570 may be coupled with select lines 560 and configured to selectively couple a digit line of the set with the sense component 545 based on the select lines 560—e.g., activated select line 360-a may activate a multiplexing transistor 371-a such that digit line 315-a may be coupled with the sense component 345 at any given time during the read operation. In some cases, the sub-word line drivers 570-a and 570-b may be placed under the array and drive the select lines 560. The select lines 560 may be coupled with the select devices of the memory array, including those above the circuit components. In some cases, the sense component 545 may include more than one sense components 545 (e.g., two sense components 245 described with reference to FIG. 2) and each sense component 545 may be configured to couple with a subset of the digit lines—e.g., sense component 245-a configured to couple with digit lines 215-a and 215-b, sense component 245-b configured to couple with digit lines 215-c and 215-d. In such cases, the digit line multiplexing component 570 may be configured to selectively couple a digit line of the subset with respected sense component—e.g., sense component 245-a coupled with digit lines 215-a, sense component 245-b coupled with digit lines 215-c.

The digit line multiplexing component drivers 575 may be coupled with the digit line multiplexing component 570 and configured to support the digit line multiplexing component drivers 575 during the read operation—e.g., providing a sufficient current to the digit line multiplexing component 570. Further, the sub-word line drivers 580 may be coupled with the set of word lines 510 and configured to access memory cells of the memory array. In some cases, the sub-word line drivers 580 may be placed under the array and drive the set of word lines 510. The set of word lines 510 may be coupled with the select devices of the memory array, including those above the circuit components.

In some cases, the sense component 545 configured to selectively couple with the set of digit lines (e.g., multiplexed digit lines) may occupy a less area of the substrate when compared to other sense component configurations (e.g., one sense component per digit line) to facilitate enhancing functionality of existing components (e.g., by providing a greater area to the existing component) or adding additional components (e.g., sub-word line driver) that otherwise may not have an adequate area of the substrate.

Figure 6:
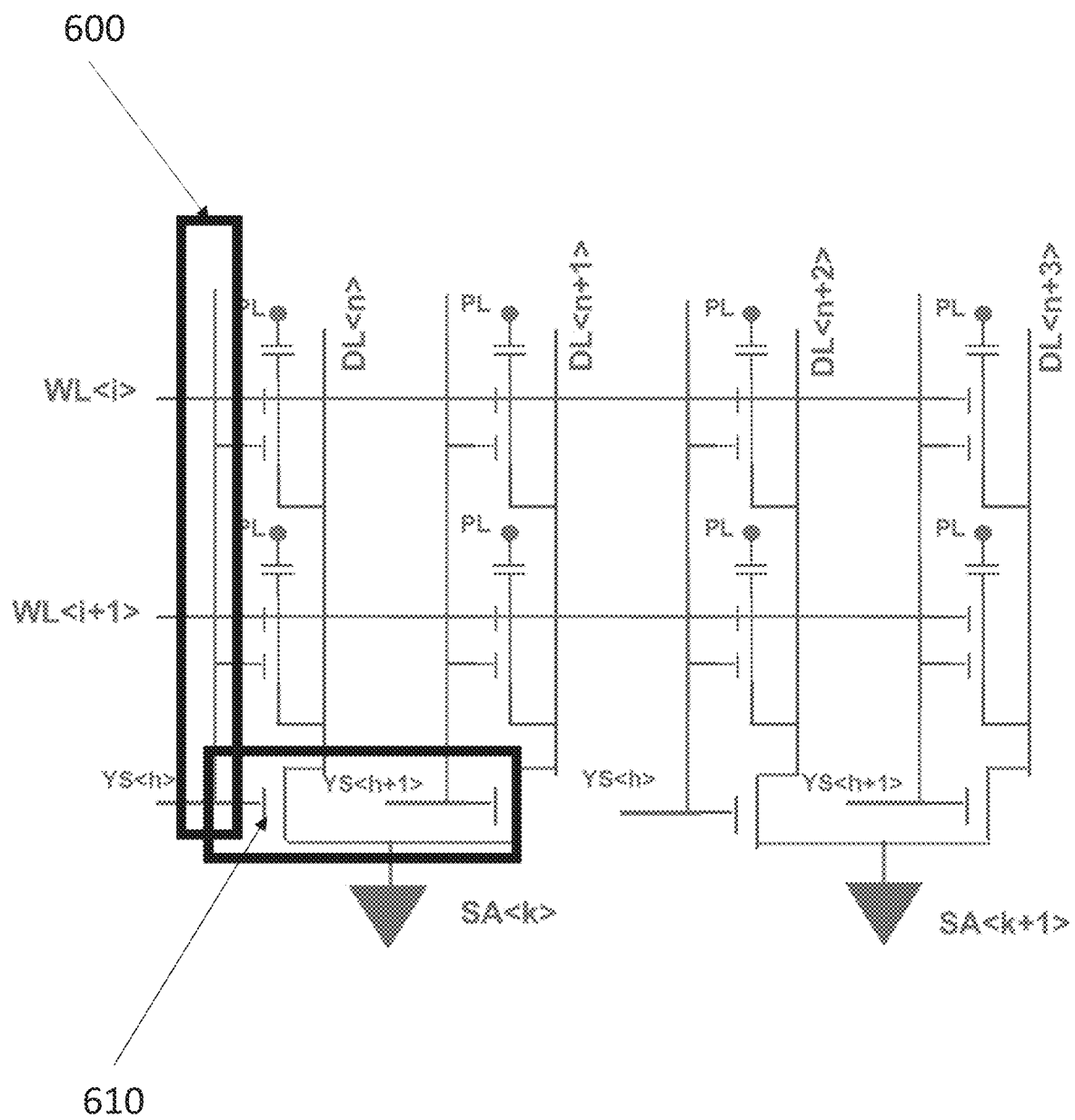
FIG. 6 illustrates a more general example of a circuit diagram that supports a 3D memory array with multiplexed digit lines and driver lines in accordance with examples as disclosed herein.

FIG. 6 is a schematic view of a 3D array of memory cells, for instance DRAM or FeRAM cells, corresponding to the example of FIG. 2A and wherein according to the present disclosure each word line WL<i> or WL<i+1> is driven by a respective word line driver (not shown). Each digit line (DL<n>, DL<n+3>) is multiplexed into a corresponding sense amplifier (SA<k>, SA<k+1>) as described below.

In order to achieve this result and mux out the several digit lines into a single sense amplifier, the line 600 associated to each respective digit line is driven with an appropriate signal YS (e.g., YS<h>, YS<h+1>, etc., for each SA) applied by a driver located under the tile (not shown in FIG. 6).

The YS driver is provided under the memory array. YS driver also drives multiplexing component 610 coupled to selection line 600. Multiplexing components 610 may be located under the memory array, in a location between the vertical connections to the memory array and the circuitry for sensing the logic level of the memory cells, in some examples. In other words, the multiplexer 610 and all the other drivers for each corresponding memory deck are provided at the bottom of the 3D memory structure and they may be split in even and odd drivers.

A driver may be simply structured with a couple of transistors, for instance a PMOS and a NMOS transistor coupled to transform a logic signal to drive the selection line 600. For instance, a driver may be a lever shift used to transform a logic selection signal having a low voltage range into a signal having higher voltage range for instance, from 0 to 1 Volt, if that is the supply logic level signal, to 1 to 3 Volt, if that is the output voltage level for the selection line.

The selection lines 600 are extended in the same direction of the digit lines and are substantially perpendicular to the word lines.

One selection line 600 is parallel to a digit line DL and is provided for each digit line DL; therefore, in some examples, each selection line 600 is associated to a respective digit line DL. It may be useful to find the space to host such selection lines inside the 3D memory structure.

According to examples of the present disclosure it has been decided to host the drivers of the selection lines 600 and the multiplexing components 610 in a sort of quilt, staggered or alternate structure to save space under the memory array.

Figure 7:
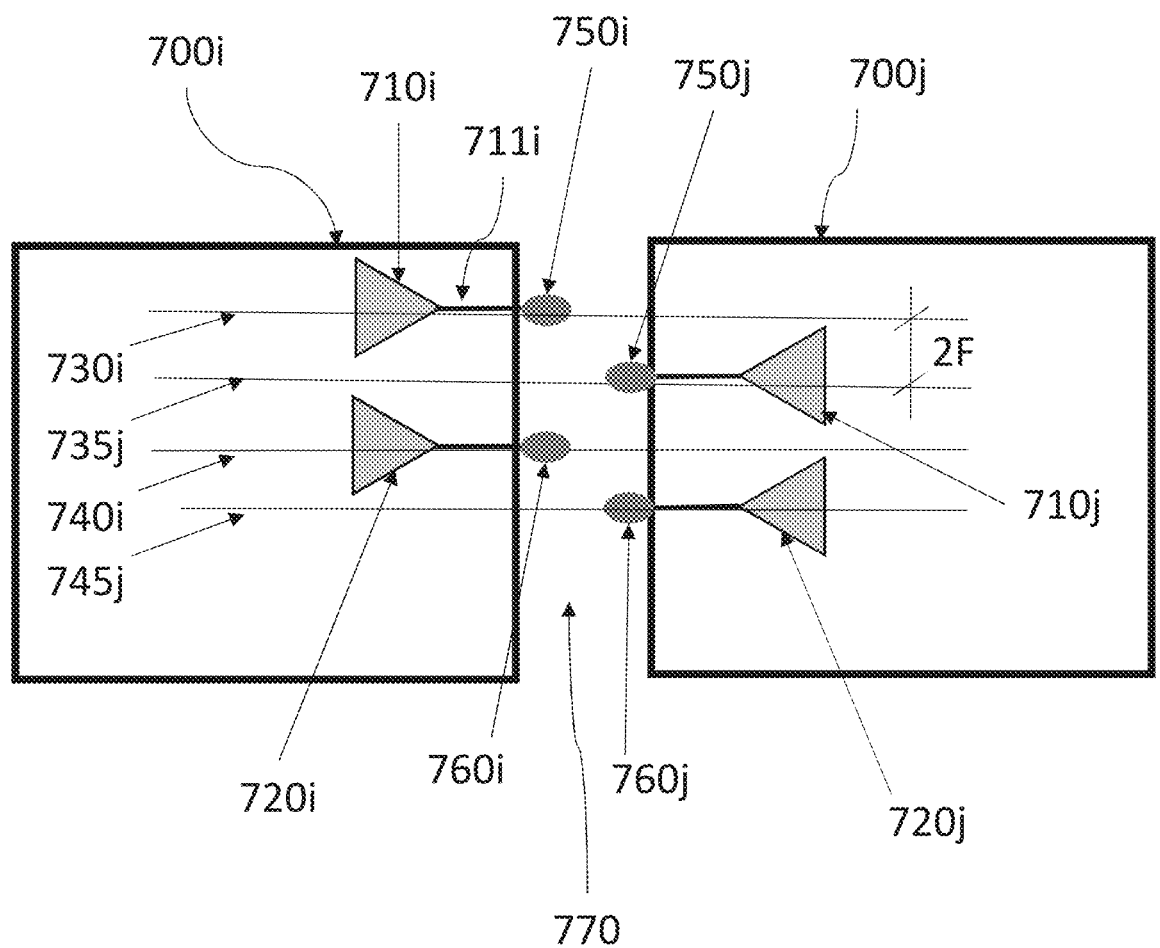
FIG. 7 is a schematic top view of a portion of the memory array wherein line drivers are provided according to examples of the present disclosure.

FIG. 7 is a schematic view of a possible disposition of the drivers coupled to each selection line. FIG. 7 is just a schematic example not drafted to scale but it is indicative of the allocation of the drivers for each tile of the memory array. The Figure may be considered a top view of a portion of the die; more specifically, a portion under the memory array is depicted in green color, while in blue are depicted vertical interconnects and access lines at one deck of the memory array.

According to examples of the present disclosure the schematic block having reference number 700i is indicative of a tile of the memory array and the other block 700j represents an adjacent tile of the same array. The drivers 710i, 720i, etc., are provided under tile 700i for driving, through interconnections 750i, 760i, etc., the corresponding selection lines 730i, 740i, etc., associated to such a tile 700i. Selection lines 730i, 740i, etc., extend over adjacent tile 700j, so they may also be coupled to respective cells therein. Opposite or faced drivers 710j, 720j, etc., are provided under the adjacent tile 700j for driving, through interconnections 750j, 760j, etc., the corresponding selection lines 735j, 745j, etc., associated to tile 700j. Selection lines 735j, 745j, etc., extend over adjacent tile 700i, so they may also be coupled to respective cells therein. Selection lines 735j, 745j, etc., are staggered with respect to the selection lines 730i, 740i, etc.; accordingly, a denser (e.g., more compact or smaller pitch/area) array may be achieved. The circles 750, 760, etc. coupled between the selection lines and the respective drivers in FIG. 7 are indicative of contact vias extended in a direction perpendicular to the drawing.

These contact vias are realized in the semiconductor area 770 between two adjacent tiles of the memory array; this separation area may be referred to as socket area or socket region.

Each driver is coupled via a conductive interconnection line located at the bottom of the memory array to vertical interconnection lines coupled to the selection lines in the memory array. For instance, in FIG. 7, driver 710i is coupled through conductive connection line 711i to vertical connection line 750i and finally to selection line 730i. Other drivers are coupled to respective selection lines in similar fashion. Selection line drivers may also be coupled to respective multiplexing components (not shown in FIG. 7). Multiplexing components may be driven by selection line drivers as described above (e.g., with reference to components 270, 370, and/or 610, for example). Gate nodes of multiplexing components may be located below the memory array (as described with reference to FIG. 5 and, in more detail, below) and they may be coupled to selection line drivers via conductive interconnections; in some examples, conductive lines 711i or extensions thereof may be used for this purpose.

According to the technology adopted to realize the memory array the above indicated lines may be physically separated by a pitch of few nanometers; for instance, if the minimum lithographic resolution is about 20 nm in the DRAM memory arrays, then the pitch between two parallel metal lines is about 2F=40 nm.

According to examples of the present disclosure, having provided staggered drivers and staggered selection lines between an even tile and an adjacent odd tile allows relaxing the lithography of the selection lines and of the corresponding interconnecting lines at the drivers output. The distance between two drivers 710i, 720i or two selection lines 750i, 760i is 4F that is to say: the double of the distance pitch 2F between the metal lines.

In other words, in view of the quilt architecture of the memory array and the staggered drivers provided in each memory tile the cost for the semiconductor manufacturing of the selection lines is relatively cheaper due to their relaxed distance.

Figure 8:
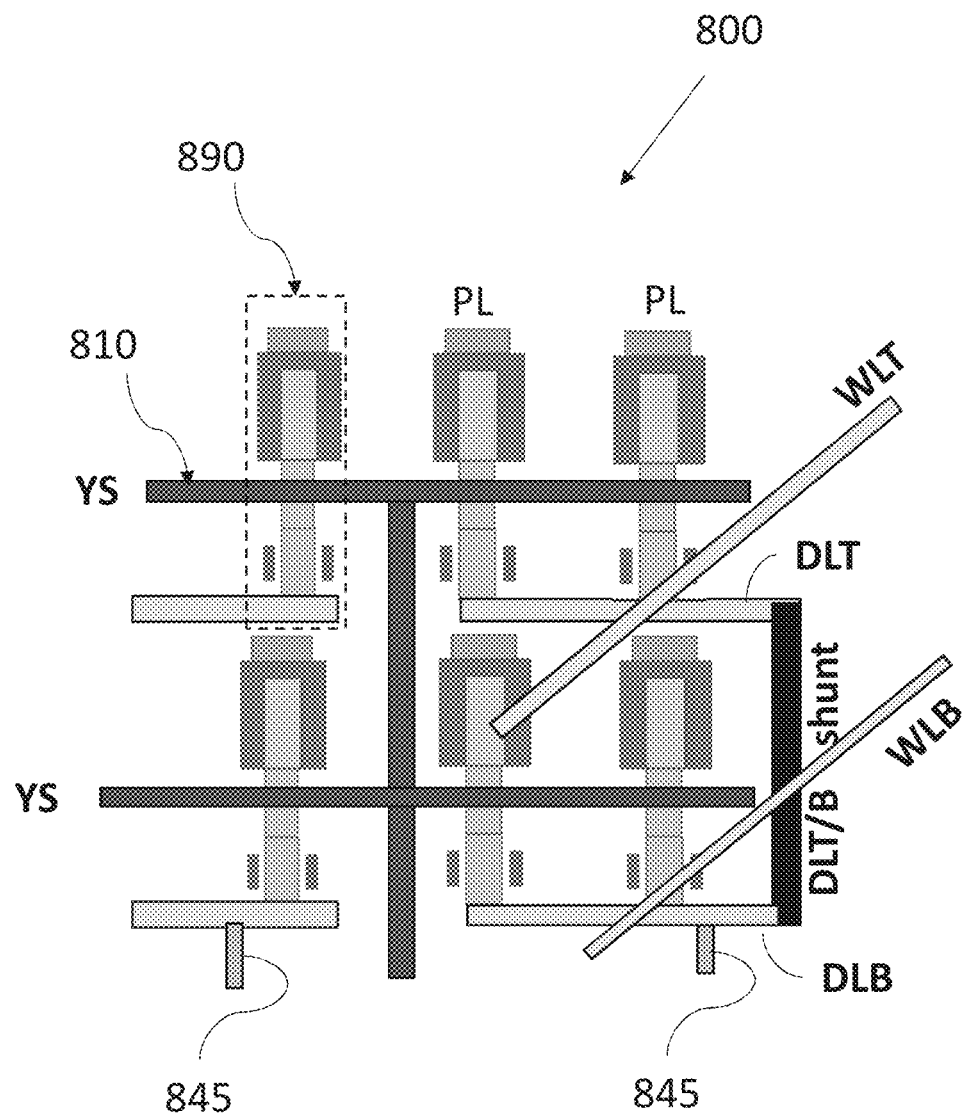
FIG. 8 is schematic view along a vertical plane of a 3D memory portion according to examples of the present disclosure.

FIG. 8 illustrates a schematic view in vertical cross section of an example of a portion 800 of a 3D memory array with multiplexed digit lines in accordance with examples as disclosed herein. Each memory cell 890 may be an example of the memory cell 290 described with reference to FIG. 2.

The memory cell 890 may include a storage or container component configured to store a logic state of the memory cell.

A node of the storage component may be coupled with the plate lines PL that may be biased to a constant voltage (e.g., plate voltage) for instance during a read operation. The memory cell 890 may include selection components for instance a first transistor a second transistor connected in a series configuration, as disclosed in the examples of the FIGS. 4C and 4D. The locations of the first and the second transistor may be interchangeable.

The 3D memory array includes at least a couple of decks, a top deck and a bottom deck in the simple schematic example, and the digit lines DLT and DLB respectively associated to the top or bottom deck are shunt by contact/via DLT/B_shunt in a socket area between adjacent tiles of the memory array.

The top and bottom word lines WLT and WLB are indicated in the figure with a schematic inclined line to represent the fact that those lines are extended perpendicularly to the drawing in the 3D architecture. Top and bottom word lines WLT and WLB are coupled to (e.g., form) word line selection transistors (the gate of which is depicted as a pair of rectangles) in series between the storage or container component of each memory cell and the top or bottom digit lines DLT or DLB.

The top/bottom digit lines DLT and DLB (which may be examples of digit lines 215 described with reference to FIG. 2) shunt the same terminal of the first transistor TFT1 of each memory cell located in both the top and the bottom disposition. In other words, the top digit lines DLT are shorted with the bottom digit lines DLB.

The sense components 845 (which may be examples of sense components 245 described with reference to FIG. 2) are schematically indicated at the bottom of the memory array. The sense components are located under the array at a bottom level where the CMOS area is located.

The selection lines 810 receive a signal YS and are shared across each deck of the 3D memory array so that the cell of a specific deck is selected by the corresponding word line (e.g., at the crossing of selected word line and selected select/digit line). In other words, only one of the top word line or the bottom word line of given tile will be active for a given active YS.

The plate lines PL (which may be examples of plate lines 265 described with reference to FIG. 2) are solid and in common to all tiles.

Finally, the digit line multiplexing components (which may be examples of multiplexing components 270 described with reference to FIG. 2—not depicted in FIG. 8) are located in a circuit portion under the tile of the array; digit line multiplexing component may driven by signal YS applied to the select line associated to the digit line.

All lines may be considered as split in even or odd lines for the corresponding even or odd tile of the memory array portion. So, the even/odd drivers are logically split under each corresponding tile, as described with reference to FIG. 7, for example.

Figure 8A:
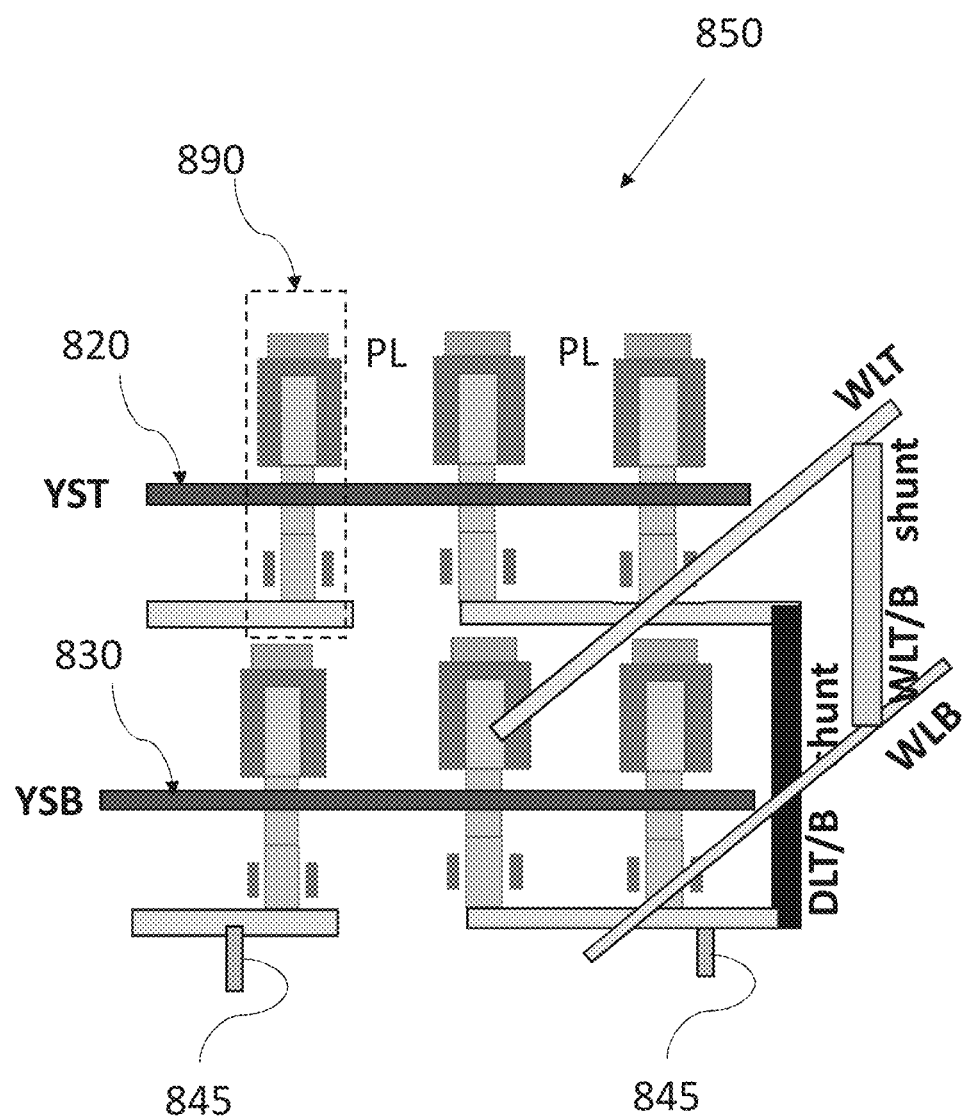
FIG. 8A is schematic alternative view along a vertical plane of a 3D memory portion according to examples of the present disclosure.

FIG. 8A illustrates an alternative schematic view in vertical cross section of an example of a portion 850 of a 3D memory array with multiplexed digit lines in accordance with examples as disclosed herein. Even in this Figure each memory cell 890 may be an example of the memory cell 290 described with reference to FIG. 2.

In this FIG. 8A respective selection lines 820 and 830 are indicated as independent connecting structures receiving respective driving signals YST and YSB for the digit lines of the top and bottom decks.

Differently from the previous example of FIG. 8, there is no more difference between top and bottom word lines, that are still indicated in the figure with a schematic inclined line to represent the fact that those lines are extended perpendicularly to the drawing in the 3D architecture. Word lines (WLT and WLB) are coupled to (e.g., form) word line selection transistors (the gate of which is depicted as a pair of rectangles) in series between the storage or container component of each memory cell and the top or bottom digit lines DLT or DLB.

In this example, however, the word lines WLT and WLB are shunt via WLT/B shunt element therefore forming a common word line (from electrical point of view) to the top and bottom decks. The example of FIG. 8A is substantially the dual version of the example of FIG. 8. In the example of FIG. 8A, a memory cell of a specific deck is selected by the corresponding select line (YST or YSB) and the common or shared word line (WLT shunted to WLB), e.g., at the crossing of selected word line and selected select/digit line. In other words, the only one of the top select line or the bottom select line of given tile will be active simultaneously with a word line.

According to this example of the quilt architecture of the 3D memory array of the present disclosure the word lines WL of at least two adjacent even and odd tiles and associated to a top or to a bottom deck are connected together, as will be clearer by the following description.

Figure 9:
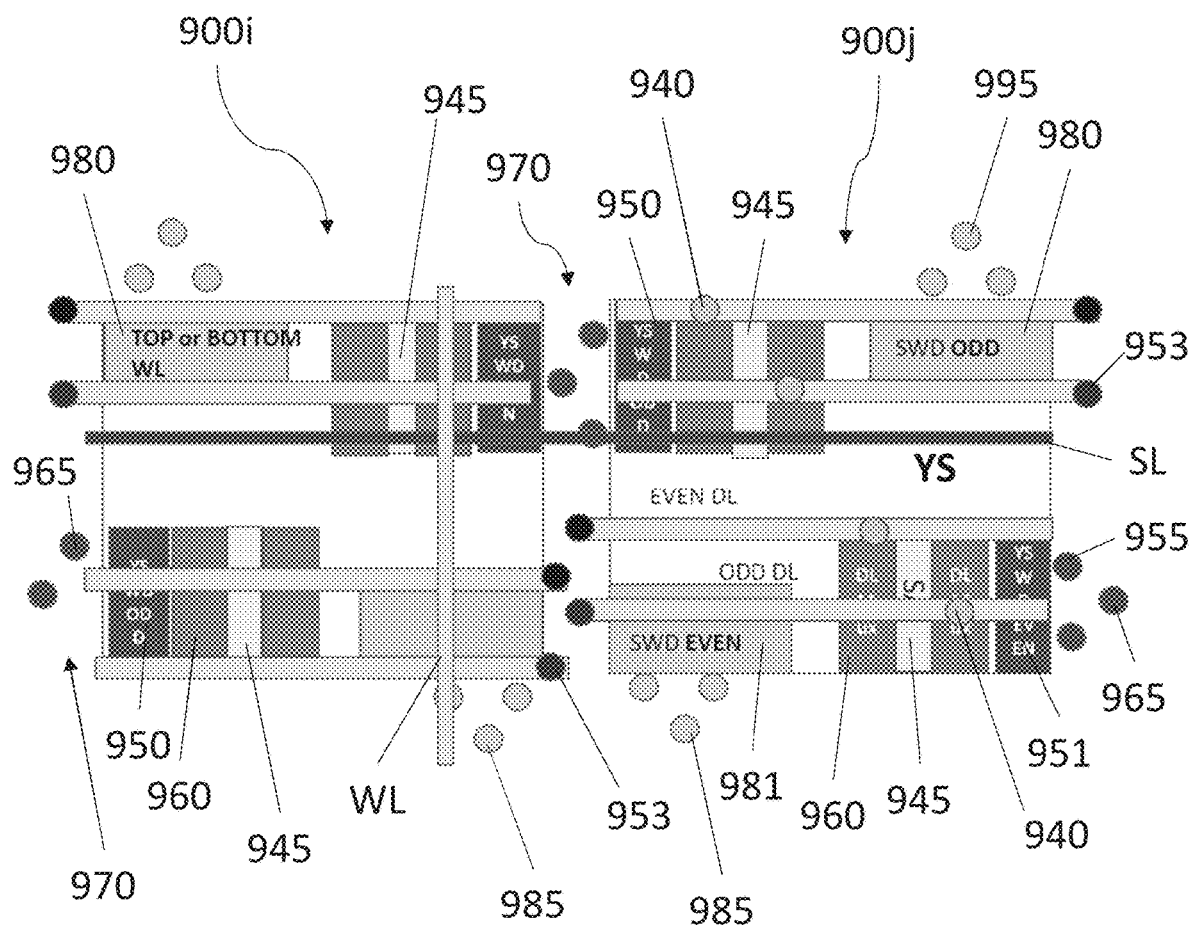
FIG. 9 is a schematic top view of a portion of a quilt memory array architecture including even and odd memory tiles in accordance with examples as disclosed herein.

Making now reference to the example of FIG. 9, it may be appreciated that a couple of generic adjacent memory tiles 900i and 900j are considered to be the even and odd portions of the quilt memory array architecture.

The quilt memory array architecture shown in FIG. 9 is a top view of the bottom portion of the memory array comprising at least a couple of adjacent memory tiles 900i and 900j each including all the drivers that are used to handle the plurality of memory cells of each memory deck.

A memory tile configuration 900i or 900j supports a memory array with multiplexed digit lines in accordance with examples as disclosed herein. Each memory tile configuration 900i or 900j illustrates a portion of components in a substrate (e.g., the substrate 404 described with reference to FIG. 4) just for clarity purposes.

The memory tile configuration 900i or 900j may include sense components 945 (SA); digit line multiplexing components 960 (DL Mux), select line drivers 951 and 950 (YS WD EVEN and YS WD ODD), and sub-word line drivers 981 and 980 (SWD EVEN and SWD ODD).

As may be appreciated, the configuration of the two adjacent tiles is substantially symmetrical and mirrored.

The socket areas 970 between the tiles 900i, 900j is dedicated to host the contact vias interconnecting the component under the array (drivers, multiplexing components, sense components) to respective access/select lines in the memory decks. So, the contacts 953 represent the vertical connection to (or a pillar portions of) the digit lines.

On the contrary, the contacts 940 are not located in the socket areas but under the memory array since they are the interconnections with the digit line multiplexing (DL Mux) areas and the sense amplifiers (SA) areas, both formed in a CMOS under the array (CuA) region, in some examples.

In FIG. 9 the numeral 985 indicates the contact vias for connecting the sub-word lines even drivers 981 (SWD EVEN) to the corresponding word lines and with 995 the other contact vias for connecting the sub-word lines odd drivers 980 (SWD ODD) with the corresponding word lines, all contact vias located in socket areas between memory tiles.

Similarly, the numeral 955 indicates the contact vias for connecting the even YS line drivers 951 (YS WD WVWN) to the corresponding even selection lines and with 965 the (staggered with respect to 955) contact vias for connecting the odd YS line drivers 950 (YS WD ODD) to the corresponding odd selection lines, all located in socket areas 970 similarly as shown in the socket area 770 in FIG. 7.

A skilled in this art will easily understand that if the example of FIG. 8A is implemented, then the driver areas 980 dedicated to the top and bottom word lines drivers would no longer be split in top and bottom drivers but would be dedicated to the all word line drivers for that specific tile.

Similarly, the driver areas 950 dedicated to the selection lines drivers would be split in top and bottom driver areas for upper and lower decks selection lines.

Figure 10:
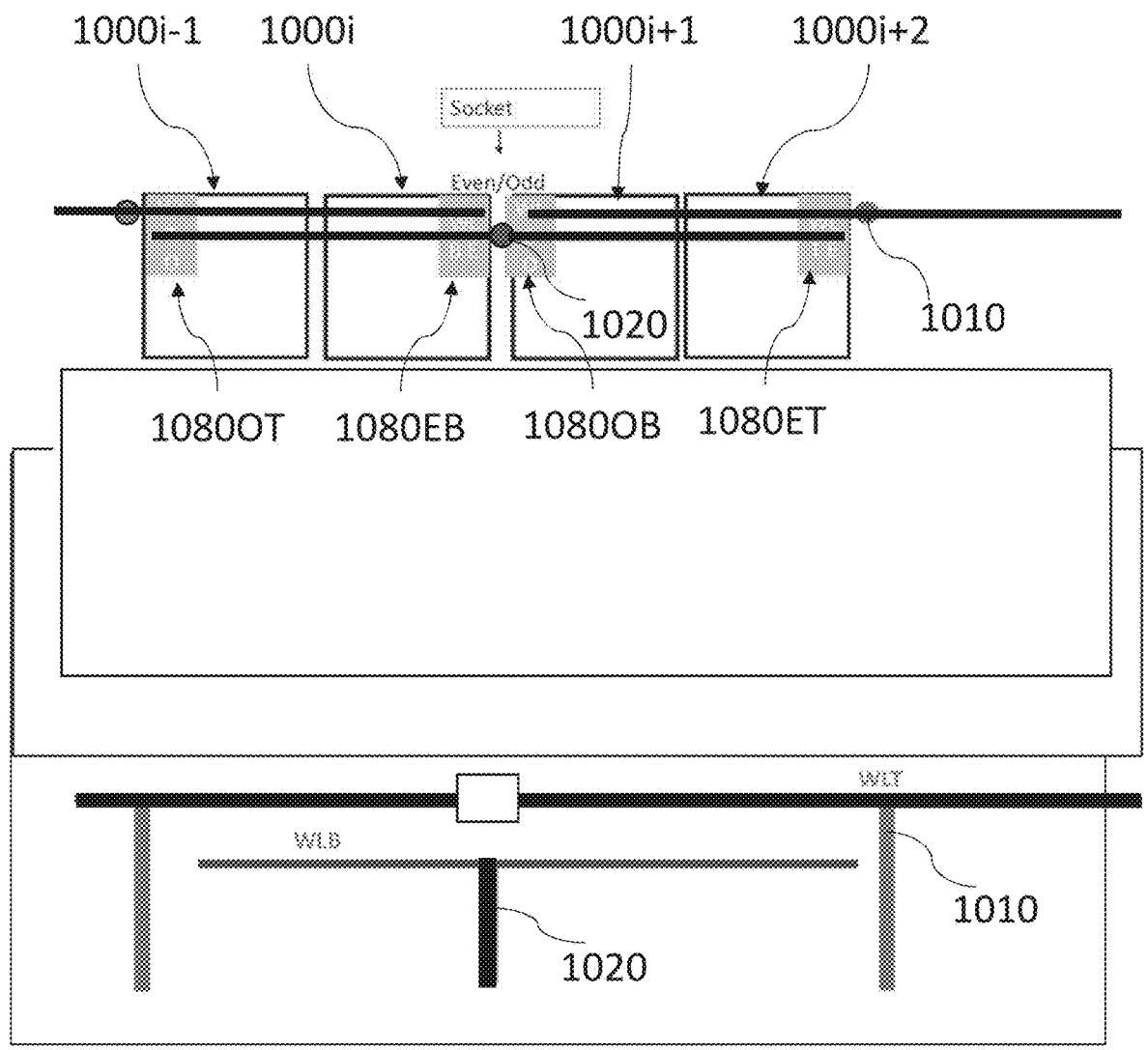
FIG. 10 is a further schematic top view of a portion of a quilt memory array architecture including even and odd memory tiles in accordance with examples as disclosed herein.

FIG. 10 shows a schematic view of a double couple of memory tiles that are indicated in a generic group of tiles 1000i−1, 1000i, 1000i+1, 10001+2, etc. A side section view is depicted in the bottom of FIG. 10, while a plan view is depicted in the top of FIG. 10; top deck and bottom deck word lines are shown with an offset in the plan view for improved visibility of both (e.g., the depicted word lines may correspond to the top (WLT) and bottom (WLB) word lines of the side section and they may either be even or odd word lines). For clearness, digit lines and associated selection lines are neither shown in top nor in bottom views of FIG. 10; digit lines are running perpendicular to word lines (e.g., between WLB and WLT) into and out of the page in bottom FIG. 10 and vertically in plan view of top portion of FIG. 10 (but yet at a different height than either WLB, red line, and TWL, blue line). Selection lines run parallel to digit lines.

Making more specific reference to a couple of adjacent tiles such as those having the reference numbers 1000i and 1000i+1 it may be appreciated that the word line WLB for the bottom deck is connected every two tiles, that is to say:

each even-odd pair. The same applies for the world line WLT for the top deck. In the depicted example, drivers 1080OT for odd word lines in top deck are located under tile 1000$i$-1, drivers 1080ET for even word lines in top deck are located under tile 1000$i$+2, drivers 1080EB for even word lines in bottom deck are located under tile 1000$i$ and drivers 1080OB for even word lines in bottom deck are located under tile 1000$i$+1.

The contact vias 1010 and 1020, respectively to top deck word lines and to bottom deck word lines, are still located in the socket area between tiles.

Therefore, according to the example of this example of FIG. 10 wherein the 3D memory array includes at least a couple of decks, the word lines of at least two adjacent even and odd tiles and associated to a top or to a bottom deck are connected together.

The architecture solution of the present disclosure related substantially to a new method for manufacturing a 3D memory device including memory cells each comprising at least a storage component, a first transistor, and a second transistor.

Figure 11:
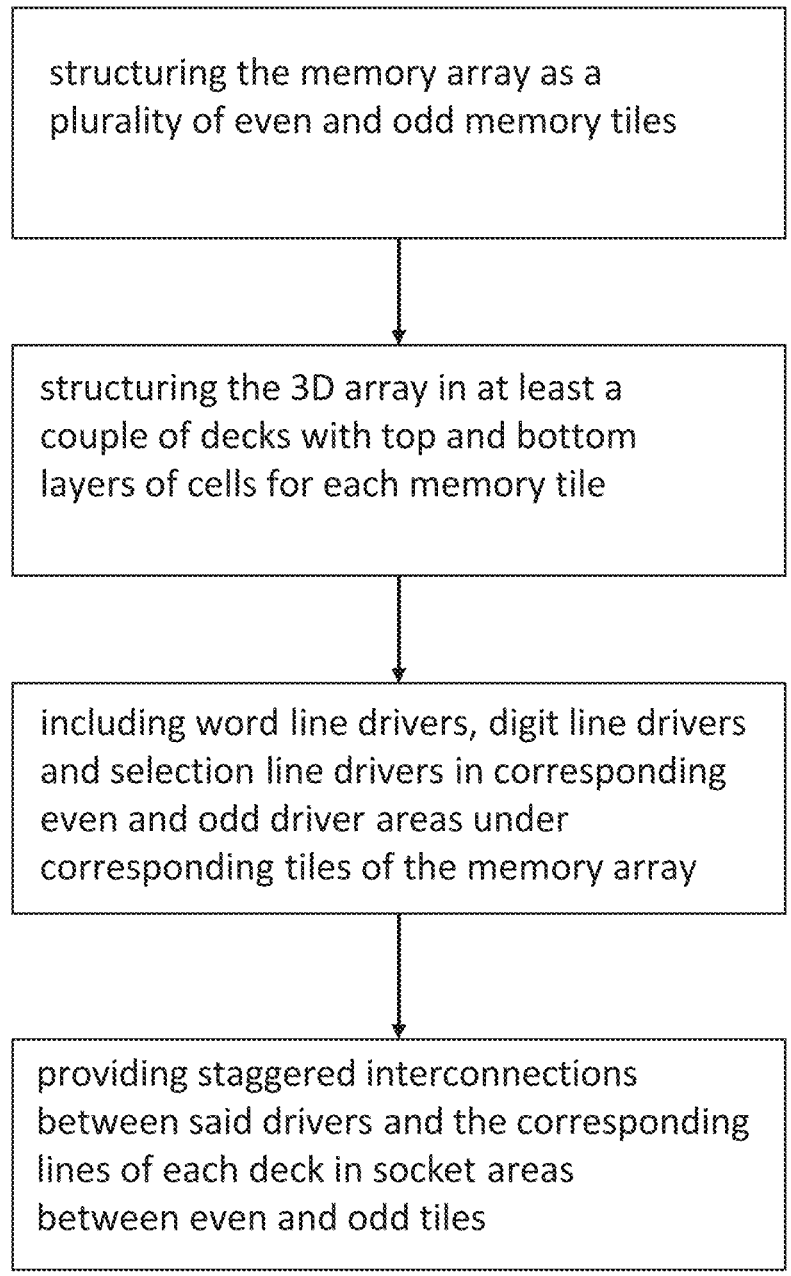
FIG. 11 shows a flowchart illustrating a method for manufacturing a 3D memory array with multiplexed digit lines in accordance with examples as disclosed herein.

The method is schematically illustrated in FIG. 11 wherein the method steps are disclosed in broad terms.

The method steps may be considered a teaching for realizing an original manner a 3D memory device structured with a plurality of memory cells coupled to word lines extended in a first direction. The cells are also coupled to digit lines extended in a second direction substantially perpendicular to the first direction.

Selection lines are also provided in parallel to the digit lines for selectively coupling the memory cells with the digit lines in a multiplexing configuration of digit lines to be coupled to a sense component.

So, in the content of the above 3D structure, the method of the present disclosure comprises the following steps:

structuring the memory array as a plurality of even and odd memory tiles;

structuring the 3D array in at least a couple of decks with top and bottom layers of cells for each memory tile;

including word line drivers, digit line drivers and selection line drivers in corresponding even and odd driver areas under corresponding tiles of the memory array;

providing staggered interconnections between said drivers and the corresponding lines of each deck in socket areas between even and odd tiles.

In other words, the architecture division in even and odd tiles allows to locate the vertical contact vias for the decks of the 3D memory structure in the socket area but staggering also the contacts and the position of the corresponding drivers to gain space in the semiconductor structure and relax the lithography of the interconnections to be realized.

The solution disclosed in the present specification has many advantages; for instance, it enables 3D DRAM devices with efficient, cost competitive CMOS under the memory array.

Moreover, the patch size can be optimized and enlarged to the purpose and the disturb from adjacent lines is minimized since lines may be kept floating (DL Mux can be designed for the purpose, in the even/odd structure).

It should be further noted that this architecture enables a more complex sense amplifier SA design to manage and extract the full charge, if needed and may reduce the active power to the minimum required bytes. In some examples, less sense components (SA) may be present than the number of digit lines. The number of sense components may be 1/N the number of digit lines based on a multiplexing number N of digit lines per sensing component, where N may be 2, 4, 8, or have different values, for example.

Finally, it is a leverage 3D technique from other memories, for instance FeRAM.

A method to select a memory cell in a memory array is disclosed. The method may comprise biasing a word line to activate a first transistor of a memory cell coupled with the word line. The method may further comprise biasing a select line to activate a second transistor of a memory cell coupled with the select line, the select line also coupled with a multiplexing component associated to a digit line. The method may further comprise coupling a storage component of the memory cell with the digit line based at least in part on biasing the word line and the select line. The method may further comprise coupling the digit line with a sense component through the multiplexing component based at least in part on biasing the select line. The method may further comprise determining, using the sense component, a logic state stored on the memory cell based at least in part on a signal received from the digit line. The operations described above may be carried out during an access operation, such as a read operation, for example. In some cases, a plate line coupled to the memory cell may be biased to facilitate the signal development on the digit line during a read access. The operations may be executed in an order different than as described. The memory cell, word line, digit line, select line, multiplexing component and sense component may be examples of the corresponding elements described with reference to FIGS. 1-10. Memory cells may be DRAM cells, FeRAM cells, or other kind of volatile or non-volatile memory cells. In some examples, the memory array may be a 3D memory array with multiple decks (e.g., at least a couple of decks) and it may be organized in tiles (e.g., even and odd tiles), as described with reference to the previous Figures. Driver circuits for word lines, select lines and digit lines may be formed in a substrate under the memory array, for example using CMOS under Array. The driver circuits may be, at least in part, be organized in even and odd driver blocks respectively located under even and odd tiles for driving even and odd word lines, and/or select lines and/or digit lines, as in some examples described above. A memory controller, such as local memory controller 160 may govern at least some of the operations described herein.

The method may further comprise biasing a second select line to deactivate a third transistor of a second memory cell coupled with the second select line, the second select line also coupled with a second multiplexing component associated to a second digit line. A second storage component of the second memory cell is not coupled with the second digit line based at least in part on deactivating the third transistor. The method may further comprise avoid coupling the second digit line with the sense component through the second multiplexing component based at least in part on biasing the second select line. In some cases, the second digit line is floated.

The method may further comprise biasing a third select line to activate a fourth transistor of a third memory cell coupled with the third select line, the third select line also coupled with a third multiplexing component associated to a third digit line. The method may further comprise coupling a third storage component of the third memory cell with the third digit line based at least in part on biasing the word line and the third select line. The method may further comprise coupling the third digit line with a second sense component through the third multiplexing component based at least in part on biasing the third select line.

According to the method, a higher number of memory cells may be coupled to each sensing component through the digit lines multiplexing circuits. Additionally and/or alternatively, cell selection by substantially concomitant word line and select line selection may result in reduced read disturb, for example in relation to unaddressed digit lines being floated. According to the method, word line and/or select line and/or digit line control signals may be generated by respective drivers that may be located under the array and may be organized in even and odd portions that may be provided under different tiles. Word lines and/or select lines and/or digit lines may extend across adjacent tiles (in some examples across 4 tiles). Word lines of different decks may be individually selectable and/or driven, allowing for common driving of select lines (e.g., select lines of different decks may be shunted and driven by a sole driver). Select lines of different decks may be individually selectable and/or driven. allowing for common driving of word lines (e.g., word lines of different decks may be shunted and driven by a sole driver).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer.

A switching component or a transistor discussed herein may represent a field-effect transistor (FET) and comprise a three terminal device including a source, drain, and gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

The invention claimed is:

1. A memory device, comprising:
   memory cells structured in a 3D array formed by a plurality of memory tiles, each memory cell coupled with a digit line and a plate line;
   a storage component, a first transistor, and a second transistor for each memory cell, wherein one of the first transistor for a memory cell or the second transistor for the memory cell has a first terminal coupled with a word line configured to select the memory cell for an access operation and the other of the first transistor or the second transistor has a second terminal coupled to a selection line parallel to the digit line for multiplexing the digit line toward a sense component; and
   a plurality of drivers, one for each selection line, provided in a staggered configuration under the 3D array, each driver of the plurality of drivers comprising one driver of even drivers or odd drivers for corresponding adjacent tiles of the 3D array.

2. The memory device of claim 1, wherein the memory cells of the 3D array comprise DRAM cells or FeRAM cells.

3. The memory device of claim 1, wherein the 3D array comprises a plurality of decks, wherein digit lines associated to a top deck or a bottom deck are shunted in a socket area between adjacent tiles of the 3D array.

4. The memory device of claim 1, wherein the 3D array is configured as a quilt architecture with adjacent memory tiles having even and odd memory portions, respectively, including word lines drivers, digit lines drivers and selection lines drivers hosted in corresponding even or odd memory tiles.

5. The memory device of claim 1, wherein the 3D array comprises a plurality of decks, wherein word lines associated to a top deck or a bottom deck are shunted in a socket area between adjacent tiles of the 3D array.

6. The memory device of claim 1, wherein the 3D array comprises a plurality of decks, wherein word lines of at least two adjacent even tiles and odd tiles and associated to a top deck or to a bottom deck are connected together.

7. The memory device of claim 1, wherein the 3D array comprises a plurality of decks, wherein word lines for a top deck and a bottom deck are connected every two tiles of each even-odd pair of tiles.

8. The memory device of claim 1, wherein connections to sense components are located under the 3D array.

9. The memory device of claim 1, wherein each memory cell of the 3D array comprises a plate and the plates of the memory cells are solid or shorted together.

10. A method for manufacturing a 3D memory device including a memory array of memory cells each coupled between a plate line and a digit line, each memory cell comprising a storage component, a first transistor coupled with a word line, and a second transistor coupled with a selection line, the method comprising:
   structuring the memory array as a plurality of even and odd memory tiles;
   structuring the memory array as a plurality of decks with top and bottom layers of memory cells for each memory tile;
   including word line drivers, digit line drivers and selection line drivers in corresponding even and odd driver areas under corresponding tiles of the memory array;
   providing staggered interconnections between said word line drivers, digit line drivers, and selection line drivers and corresponding lines of each deck in socket areas between even and odd tiles.

11. The method of claim 10, wherein:
digit lines associated to a top deck or a bottom deck are shunted in a socket area between adjacent tiles of the memory array.

12. The method of claim 10, wherein:
selection lines associated to a top deck or a bottom deck are connected to corresponding drivers through contact vias provided in a socket area between adjacent tiles of the memory array.

13. The method of claim 10, wherein:
word lines of at least two adjacent even and odd tiles and associated to a top deck or to a bottom deck are connected together.

14. The method of claim 10, wherein:
a selection line is shared among a plurality of memory cells of the plurality of decks and word lines of the plurality of decks are independent of word lines of other decks.

15. The method of claim 10, wherein:
a word line is shared among a plurality of memory cells of the plurality of decks and selection lines of the plurality of decks are independent of selection lines of other decks.

16. The method of claim 10, wherein:
the memory cells of the memory array are DRAM cells or FeRAM cells.

* * * * *